(12) United States Patent
Reusswig et al.

(10) Patent No.: US 11,398,288 B1
(45) Date of Patent: Jul. 26, 2022

(54) STORAGE MEDIUM-ASSISTED SYSTEM INTERFACE TRAINING SCHEME

(71) Applicant: SANDISK TECHNOLOGIES LLC, Addison, TX (US)

(72) Inventors: Phil Reusswig, Mountainview, CA (US); Sahil Sharma, San Jose, CA (US); Rohit Sehgal, San Jose, CA (US); Niles Yang, Mountainview, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 17/326,414

(22) Filed: May 21, 2021

(51) Int. Cl.
| | | |
|---|---|---|
| *G11C 29/00* | (2006.01) |
| *G11C 29/10* | (2006.01) |
| *G11C 29/36* | (2006.01) |
| *G11C 29/12* | (2006.01) |
| *G11C 29/44* | (2006.01) |
| *G11C 29/56* | (2006.01) |

(52) U.S. Cl.
CPC ........ *G11C 29/10* (2013.01); *G11C 29/12005* (2013.01); *G11C 29/12015* (2013.01); *G11C 29/36* (2013.01); *G11C 29/44* (2013.01); *G11C 29/56* (2013.01); *G11C 2029/3602* (2013.01); *G11C 2029/5602* (2013.01)

(58) Field of Classification Search
CPC .............. G11C 29/10; G11C 29/12005; G11C 29/12015; G11C 29/36; G11C 29/44; G11C 29/56; G11C 2029/3602; G11C 2029/5602
See application file for complete search history.

(56) References Cited

U.S. PATENT DOCUMENTS

| | | | | |
|---|---|---|---|---|
| 2007/0234143 A1* | 10/2007 | Kim | ........................ | G11C 29/44 |
| | | | | 714/718 |
| 2018/0374555 A1* | 12/2018 | Kwon | ..................... | G11C 29/36 |

* cited by examiner

*Primary Examiner* — Mohammed A Bashar
(74) *Attorney, Agent, or Firm* — Morgan, Lewis & Bockius LLP

(57) ABSTRACT

A data storage system includes a storage medium and a storage controller configured to perform interface training operations. The interface training operations include loading a test data pattern into a first controller buffer of the storage controller, loading the test data pattern into a first storage medium buffer of the storage medium, setting a first read voltage or timing parameter at the storage controller, transferring the test data pattern from the first storage medium buffer to a second controller buffer of the storage controller using the first read voltage or timing parameter, comparing the test data pattern in the first controller buffer with the test data pattern in the second controller buffer, and determining a first read transfer error rate based on the first comparison.

20 Claims, 10 Drawing Sheets

| Parameter Set | Error Rate |
| --- | --- |
| 01 | Very High |
| 02 | High |
| 03 | High |
| 04 | Low |
| 05 | Low |
| 06 | No Errors |
| 07 | No Errors |
| 08 | No Errors |
| 09 | Low |
| 10 | Low |
| 11 | High |
| 12 | High |

Window Center 604 → (07)

Window 602 (06–08)

STORAGE MEDIUM-ASSISTED SYSTEM INTERFACE TRAINING SCHEME

TECHNICAL FIELD

The present disclosure relates to a training scheme at an interface between a storage controller and a storage medium of a data storage system.

BACKGROUND

Non-volatile memories, such as flash memory devices, have supported the increased portability of consumer electronics, and have been utilized in relatively low power enterprise storage systems suitable for cloud computing and mass storage. The ever-present demand for almost continual advancement in these areas is often accompanied by demand to improve data storage capacity. The demand for greater storage capacity in turn stokes demand for greater performance (e.g., quicker reads and writes), so that the addition of storage capacity does not slow down the memory device. As such, there is ongoing pressure to increase the capacity and the operating speed of non-volatile memories in order to further improve the useful attributes of such devices.

SUMMARY

This application describes various systems and methods of a training scheme at an interface between a storage controller and a storage medium. As data storage systems move to higher interface speeds, such systems tend to implement interface training (IFT). IFT parameters may be applied and/or updated at drive manufacture, at initialization, and possibly during runtime depending on operating conditions (e.g., due to temperature changes). IFT adds to the overhead during initialization and runtime. As such, the time should be kept to a minimum.

IFT operations may be performed for read or write transfers at the interface between the storage controller and storage medium. The IFT implementations described herein improve the performance of non-volatile data storage systems by minimizing relatively slow data transfers between the storage controller and the storage medium during IFT.

In one aspect, a data storage system includes a storage medium including a plurality of memory cells; a storage controller in communication with the storage medium; and an electrical interface configured to pass data via a channel disposed between first interface circuitry in the storage controller and second interface circuitry included in the storage medium.

The storage controller and the storage medium are configured to perform interface training operations at the first interface circuitry and the second interface circuitry.

In some implementations, the interface training operations include loading a test data pattern into a first controller buffer of the storage controller.

In some implementations, the interface training operations include loading the test data pattern into a first storage medium buffer of the storage medium.

In some implementations, the storage controller is configured to set a first read voltage or timing parameter; transfer the test data pattern from the first storage medium buffer to a second controller buffer of the storage controller using the first read voltage or timing parameter; compare, as a first comparison, (i) the test data pattern in the first controller buffer with (ii) the test data pattern in the second controller buffer; and determine a first read transfer error rate based on the first comparison.

In some implementations, the storage controller is further configured to set a second read voltage or timing parameter different from the first read voltage or timing parameter; transfer the test data pattern from the first storage medium buffer to the second controller buffer using the second read voltage or timing parameter; compare, as an updated first comparison, (i) the test data pattern in the first controller buffer with (ii) the test data pattern in the second controller buffer; and determine a second read transfer error rate based on the updated first comparison.

In some implementations, the storage controller is further configured to determine, as a first determination, that the second read transfer error rate is lower than the first read transfer error rate or is below a predetermined read transfer error rate threshold.

In some implementations, the storage controller is further configured to set a runtime read voltage or timing parameter to the second read voltage or timing parameter based on the first determination.

In another aspect, the storage controller is configured to set a first write voltage or timing parameter; and transfer the test data pattern from the first controller buffer to a second storage medium buffer of the storage medium using the first write voltage or timing parameter; and the storage medium is configured to compare, as a second comparison, (i) the test data pattern in the first storage medium buffer with (ii) the test data pattern in the second storage medium buffer; determine a first write transfer error rate based on the second comparison; and transmit the first write transfer error rate to the storage controller.

In some implementations, the storage controller is further configured to set a second write voltage or timing parameter different from the first write voltage or timing parameter; and transfer the test data pattern from the first controller buffer to the second storage medium buffer using the second write voltage or timing parameter; and the storage medium is further configured to compare, as an updated second comparison, (i) the test data pattern in the first storage medium buffer with (ii) the test data pattern in the second storage medium buffer; determine a second write transfer error rate based on the updated second comparison; and transmit the second write transfer error rate to the storage controller.

In some implementations, the storage controller is further configured to determine, as a second determination, that the second write transfer error rate is lower than the first write transfer error rate or is below a predetermined write transfer error rate threshold; and set a runtime write voltage or timing parameter to the second write voltage or timing parameter based on the second determination.

In some implementations, the storage controller includes controller memory storing the test data pattern.

In some implementations, the storage controller includes storage medium memory storing the test data pattern.

In some implementations, loading the test data pattern into the first controller buffer includes loading the test data pattern from the controller memory to the first controller buffer.

In some implementations, loading the test data pattern into the first storage medium buffer includes loading the test data pattern from the storage medium memory to the first storage medium buffer.

In another aspect, a method of performing interface training operations at a data storage system includes any subset of the operations described above with reference to the data storage system.

Various implementations of systems and methods within the scope of the appended claims each have several aspects, no single one of which is solely responsible for the desirable attributes described herein. Without limiting the scope of the appended claims, some prominent features are described. After considering this discussion, and particularly after reading the section entitled "Detailed Description" one will understand how the features of various implementations are used to improve performance at the interface.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

FIG. 6 is a table of data transfer parameter sets and corresponding error rates in accordance with some implementations.

Figure 1:
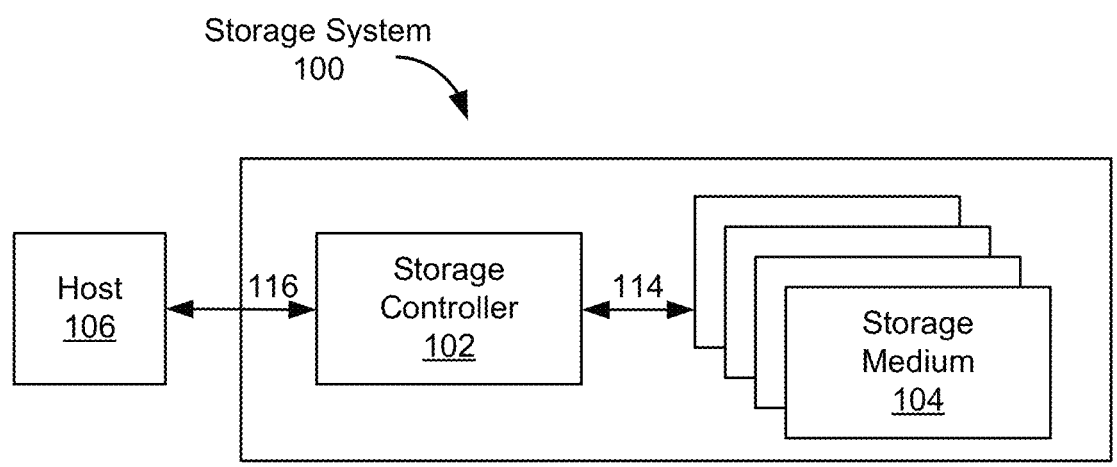
FIG. 1 is a functional block diagram of a data storage system in accordance with some implementations.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals are used to denote like features throughout the specification and figures.

DETAILED DESCRIPTION

FIG. 1 is a functional block diagram of a non-volatile storage system in accordance with some implementations. Storage system 100 includes a storage controller 102 (sometimes referred to as a flash memory controller) and non-volatile memory that may be made up of one or more storage mediums 104 (sometimes referred to as memory dies). As used herein, the term storage medium (or memory die) refers to a plurality of non-volatile memory cells (e.g., one or more memory arrays), and associated circuitry (e.g., peripheral circuitry) for managing the physical operation of the non-volatile memory cells. In some implementations, the memory cells and associated circuitry are formed on a single semiconductor substrate. Storage controller 102 interfaces with a host system 106 (also referred to as a host) and transmits command sequences for read, program, and erase operations to storage medium(s) 104. Throughout this disclosure, reference may be made to a single storage medium 104. However, it should be understood that such features may additionally or alternatively be implemented across a plurality of storage mediums 104.

The storage controller 102 manages data stored on one or more storage mediums 104 (e.g., flash memory) and communicates with a host 106, such as a computer or electronic device. The storage controller 102 can have various functionality in addition to the specific functionality described herein. For example, the storage controller 102 can format the storage medium 104 to ensure the memory is operating properly, map out bad memory cells, and allocate spare memory cells to be substituted for future failed memory cells. Some part of the spare memory cells can be used to hold firmware to operate the storage controller 102 and implement other features.

In operation, when the host 106 needs to read data from or write data to a storage medium 104, the host 106 communicates with the storage controller 102. If the host 106 provides a logical address to which data is to be read/written, the storage controller 102 may convert the logical address received from the host 106 to a physical address in the storage medium 104. Alternatively, the host 106 may provide the physical address. The storage controller 102 may also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The storage medium(s) 104 may include any suitable non-volatile storage medium, including NAND flash memory cells and/or NOR flash memory cells. The memory cells can take the form of solid-state (e.g., flash) memory cells and can be one-time programmable, few-time programmable, or multi-time programmable. The memory cells can also be single-level cells (SLC), multiple-level cells (MLC), triple-level cells (TLC), quad-level cells (QLC), or use other memory cell level technologies. Also, the memory cells can be fabricated in a two-dimensional or three-dimensional fashion.

The interface between the storage controller 102 and the storage medium(s) 104 may be any suitable flash interface, such as Toggle Mode or Open NAND Flash Interface (ONFI).

In some implementations, storage system 100 may be a card-based system, such as a secure digital (SD) or a micro secure digital (micro-SD) card. In some implementations, storage system 100 may be part of an embedded storage system. For example, the storage controller 102 and storage medium(s) 104 may be embedded within the host 106, such as in the form of a solid-state disk (SSD) drive installed in a computer. Such an SSD may emulate, replace, or be used instead of a hard disk drive inside the host 106, or be used as a NAS device, and so forth. In any case, such an SSD need not be made to work as a hard drive.

Although in the example illustrated in FIG. 1, storage system 100 includes a single channel between storage controller 102 and storage medium 104, the subject matter described herein is not limited to having a single memory channel. For example, in some storage system architectures, two, four, eight, or more channels may exist between the storage controller 102 and the storage medium(s) 104, depending on controller capabilities. In any of the implementations described herein, a plurality of channels may exist between the storage controller 102 and the storage medium(s) 104, even if a single channel is depicted in the drawings.

In some implementations, an intermediate storage controller (not shown) may interface the host 106 with the storage controllers 102 of a plurality of storage systems 100. The interface between the intermediate storage controller and the plurality of storage systems 100 may be a bus interface, such as a serial advanced technology attachment (SATA) or peripheral component interface express (PCIe) interface. The plurality of storage systems 100 may be implemented in a solid state drive (SSD), such as found in portable computing devices, such as laptop computers, tablet computers, or mobile devices.

In some implementations, a plurality of intermediate storage controllers (not shown) may respectively interface the host 106 with the storage controllers 102 of a plurality of storage systems 100. Such a system may be referred to as a hierarchical storage system. The host 106 may access memories within the storage systems 100 via a bus interface. In some implementations, the bus interface may be an NVMe or fiber channel over Ethernet (FCoE) interface. In some implementations, a hierarchical storage system may be a rack mountable mass storage system that is accessible by multiple host 106 computers, such as would be found in a data center or other location where mass storage is needed.

Figure 2:
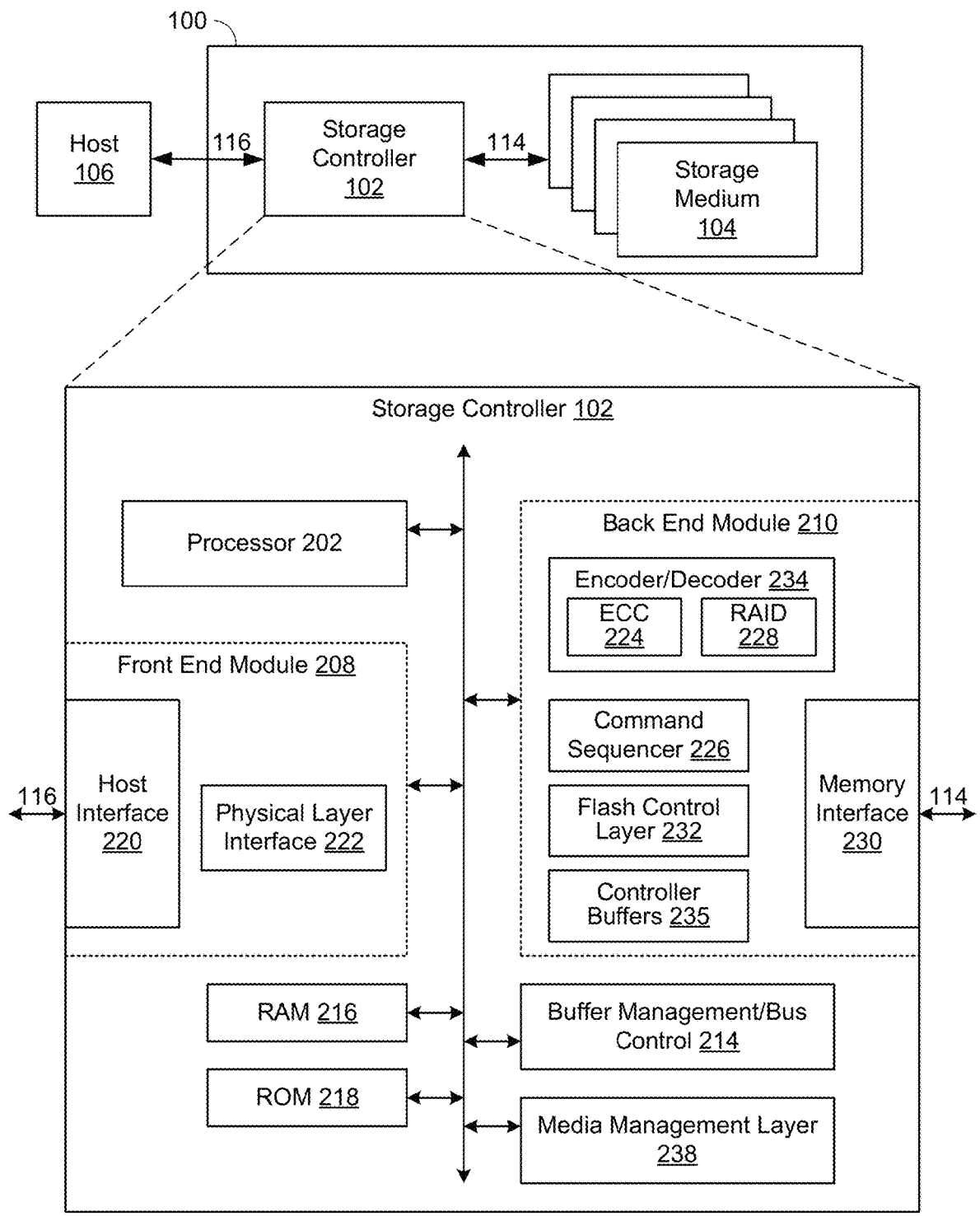
FIG. 2 is a functional block diagram of an example storage controller of the storage system of FIG. 1 in accordance with some implementations.

FIG. 2 is a functional block diagram of an example storage controller 102 of the storage system 100 in accordance with some implementations. Storage controller 102 includes a front-end module 208 that interfaces with a host 106, a back-end module 210 that interfaces with one or more non-volatile storage mediums 104, and various other modules that perform functions described herein.

The storage controller 102 can take the form of processing circuitry, a microprocessor or processor, and a non-transitory computer-readable medium that stores computer-readable program code (e.g., firmware) executable by the (micro) processor, logic gates, switches, an application specific integrated circuit (ASIC), a programmable logic controller, and/or an embedded microcontroller, for example. Storage controller 102 can be configured with hardware and/or firmware to perform the various functions described herein. Also, some of the components shown as being internal to the storage controller 102 (e.g., RAM 216 and ROM 218) can also be stored external to the storage controller 102, and other components can be used. Additionally, the phrase "operatively in communication with" could mean directly in communication with or indirectly (wired or wireless) in communication with through one or more components, which may or may not be shown or described herein.

The components of storage controller 102 depicted in FIG. 2 may take the form of a packaged functional hardware unit (e.g., an electrical circuit) designed for use with other components, a portion of a program code (e.g., software or firmware) executable by a (micro)processor or processing circuitry (or one or more processors) that usually performs a particular function or related functions, or a self-contained hardware or software component that interfaces with a larger system. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include or comprise software stored in a processor readable device (e.g., memory) to program one or more processors for storage controller 102 to perform the functions described herein.

The storage controller 102 may include a buffer manager/bus controller 214, configured to manage buffers in random access memory (RAM) 216 and control the internal bus arbitration of the storage controller 102. A read only memory (ROM) 218 may store system boot code. Although illustrated in FIG. 2 as located within the storage controller 102, in some implementations one or both of the RAM 216 and ROM 218 may be located separately from the storage controller 102. In yet other implementations, portions of RAM 216 and ROM 218 may be located both within the storage controller 102 and outside the storage controller 102. Further, in some implementations, the storage controller 102, RAM 216, and ROM 218 may be located on separate semiconductor dies.

The storage controller 102 may include one or more processors 202 configured to control the overall operation of the storage controller 102. The processor 202 may issue commands to control circuitry 310 (FIG. 3) of storage medium 104, or to any other component of storage medium 104, via memory interface 230. In some implementations, the ROM 218 and/or RAM 216 may comprise code such as a set of instructions, and the processor 202 may be operable to execute the set of instructions to provide the functionality described herein. Additionally or alternatively, the processor 202 may access code from a portion of the memory array 350 (FIG. 3) in the storage medium 104, such as a reserved area of memory cells connected to one or more word lines.

The front-end module 208 includes a host interface 220 that provides a communication interface with the host 106. The choice of the type of host interface 220 can depend on the type of memory being used. Examples of host interfaces include, but are not limited to, SATA, SATA Express, SAS, Fibre Channel, USB, PCIe, and NVMe. The host interface 220 is a communication interface that facilitates transfer for data, control signals, and timing signals. The host interface 220 may include electrical interface circuitry that provides a physical connection to the channel(s) 116 connecting the storage controller 102 to the host. This electrical interface circuitry may be part of the host interface 220, or may be separately described as a physical layer interface 222.

In some implementations, the host interface 220, in communication with ROM 218, RAM 216, and/or processor 202, may be an electrical circuit that provides an electrical interface between the storage controller 102 and the host 106. For example, the host interface 220 may change the format or timing of signals, provide a buffer, isolate from surges, latch I/O, and so forth. Commands and data from the host 106 are received by the storage controller 102 via the host interface 220. Data sent to the host 106 is transmitted via the host interface 220.

The back-end module 210 includes a memory interface 230 that provides command sequences and data (to be written) to storage medium(s) 104 and receives status information and data (that was read) from storage medium(s)

104. In some implementations, the memory interface 230 may be a double data rate (DDR) interface such as Toggle Mode or ONFI.

In some implementations, the memory interface 230, in communication with ROM 218, RAM 216, and/or processor 202, may be an electrical circuit that provides an electrical interface between the storage controller 102 and the storage medium 104. For example, the memory interface 230 may change the format or timing of signals, provide a buffer, isolate from surges, latch I/O, and so forth.

The back-end module 210 may include an error correction controller (ECC) engine 224 and/or a Redundant Array of Independent Dies (RAID) module 228. The ECC engine 224 may be configured to encode data received from the host 106, and decode and error correct data read from the storage medium 104. The RAID module 228 may be configured to manage generation of RAID parity and recovery of failed data. The RAID parity may be used as an additional level of integrity protection for the data being written into the storage medium 104. In some implementations, the RAID module 228 may be a part of the ECC engine 224. The RAID parity may be added as an extra die or dies as implied by the common name, but it may also be added within the existing die, e.g., as an extra plane, or extra block, or extra WLs within a block. ECC engine 224 and RAID module 228 may both calculate redundant data that can be used to recover when errors occur and may be considered examples of redundancy encoders. Together, ECC engine 224 and RAID module 228 may be considered to form a combined redundancy encoder/decoder 234.

The back-end module 210 may include a command sequencer 226, and/or a flash control layer 232. The command sequencer 226 may generate command sequences, such as program and erase command sequences, for transmission to storage medium 104. The flash control layer 232 may control the overall operation of the back-end module 210.

The back-end module 210 may include controller buffers 235 (e.g., latch circuits) for latching data to be written to the storage medium 104 via the memory interface 230, and for latching data read from the storage medium 104 via the memory interface 230. In some implementations, the controller buffers 235 are included in the memory interface circuitry.

The storage controller 102 may include a media management layer 238, which performs wear leveling of memory cells of storage medium 104. The storage controller 102 may also include other discrete components (not shown), such as external electrical interfaces, external RAM, resistors, capacitors, or other components that may interface with storage controller 102. In some implementations, one or more of the physical layer interface 222, RAID module 228, media management layer 238 and buffer management/bus controller 214 are optional components that are not necessary in the storage controller 102.

The Flash Translation Layer (FTL) or Media Management Layer (MML) 238 may be integrated as part of the flash management that may handle flash errors and interfacing with the host 106. In particular, the MML 238 may be a module in flash management and may be responsible for the internals of NAND management. In particular, the MML 238 may include an algorithm in the storage device firmware which translates writes from the host 106 into writes to the storage medium 104. The MML 238 may be needed because: 1) storage medium 104 may have limited endurance; 2) storage medium 104 may only be written in multiples of pages; and/or 3) a selected portion of memory cells of the storage medium 104 may not be written unless it is erased as a block (i.e. a block may be considered to be a minimum unit of erase and such a non-volatile memory may be considered a block-erasable non-volatile memory). The MML 238 may address these potential limitations of the storage medium 104 which may not be visible to the host 106. Accordingly, the MML 238 may translate write operations received from the host 106 into write operations for transmission to the storage medium 104.

Figure 3:
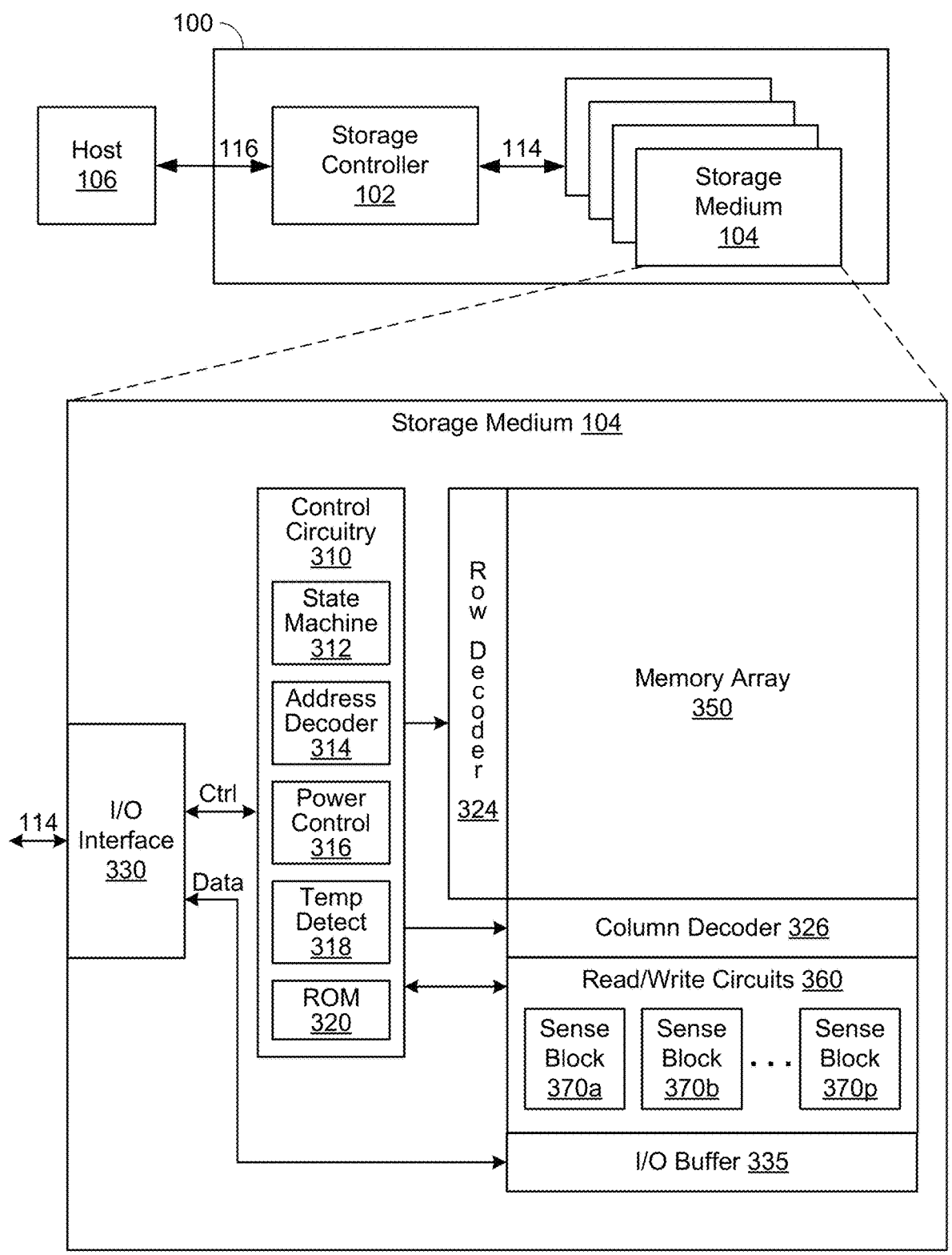
FIG. 3 is a functional block diagram of an example storage medium of the storage system of FIG. 1 in accordance with some implementations.

FIG. 3 is a functional block diagram of an example storage medium 104 of the storage system 100 in accordance with some implementations. Storage medium 104 includes a memory array 350 including a plurality of memory cells, control circuitry 310, read/write circuits 360, and an input/output (I/O) interface 330.

In some implementations, a storage controller 102 (as described above with reference to FIG. 2) may included in the same storage device (e.g., a removable storage card) as the storage medium(s) 104. However, in other implementations, the storage controller 102 may be separated from the storage medium(s) 104. In some implementations, the storage controller 102 may be disposed on a different die than the storage medium 104. In some implementations, one storage controller 102 may communicate with a plurality of storage mediums 104. In some implementations, each storage medium 104 may have its own storage controller 102.

Commands and data may be transferred between the host 106 and the storage controller 102 via a data bus 116, and between the storage controller 102 and storage medium(s) 104 via an interface channel 114. In some implementations, the I/O interface 330 includes a set of I/O pins (also referred to as pads) that connect to respective communication lines of the interface channel 114. The I/O interface 330 may be connected to the control circuitry 310, row decoder 324, column decoder 326, read/write circuits 360, and/or memory array 350.

The I/O interface 330 may be a synchronous interface or an asynchronous interface. Examples of an I/O interface include a Toggle Mode Interface and an Open NAND Flash Interface (ONFI). Other I/O interfaces can also be used. Toggle mode (e.g., Toggle Mode 2.0 JEDEC Standard or Toggle Mode 800) is an asynchronous memory interface that supports SDR and DDR with a DQS signal acting as a data strobe signal.

Data received at the I/O interface 330 for writing to the memory array 350 (in accordance with a write command) is latched in an I/O buffer 332 before being written to the memory array 350. Similarly, data that is read from the memory array 350 (in accordance with a read command) is latched in the I/O buffer 332 before being transmitted to the storage controller 102 via the I/O interface 330. The I/O buffer 332 may be included in the I/O interface 330 or otherwise communicatively coupled to the I/O interface 330. The I/O buffer 332 includes a plurality of data latches 335. In some implementations, the data latches 335 are arranged in groups of 8 (XDL0 through XDL7) or 16 (XDL0 through XDL15), depending on how many bits the I/O interface 330 is configured to receive or transmit at a time.

The read/write circuits 360 include multiple sense blocks 370 including 370a through 370p (sensing circuitry) and allow a page (or multiple pages) of data in multiple memory cells of the memory array 350 to be read or programmed (written) in parallel. In some implementations, each sense block 370 includes one or more sense amplifiers (SA) 375 connected to respective bit lines of the memory array 350. The sense amplifiers sense voltage signals associated with selected memory cells (e.g., determining whether a given memory cell is conducting current during a sense operation, or how much current the given memory cell conducts during the sense operation). The sense amplifiers then amplify the sensed voltages to levels that are optimized for the I/O circuitry of the storage medium 104, interface channel 114, and storage controller 102.

Each bit line of the memory array 350 is coupled to a sense block 370, each of which includes one or more sense amplifiers. The sense amplifiers sense voltages on each bit line in accordance with read operations. The sense amplifiers sense the low power signals from respective bitlines that represents data bits (1 or 0) stored in respective memory cells. The sense amplifiers amplify small voltage swings to recognizable logic levels so the data can be interpreted properly by logic outside the memory array (e.g., storage controller 102). After a sense amplifier for a particular bit line amplifies the sensed voltage to a normal logic level, the bit from the desired cell is then latched from the cell's sense amplifier into a data latch in the I/O buffer 332, and transferred to the storage controller 102 on data lines DQ of the output bus 114.

The sense amplifiers sense data read onto corresponding bit lines from a plurality of memory cells associated with the corresponding bit lines. The sense amplifiers may include bit line drivers for applying a voltage to corresponding bit lines in accordance with write data. The sense amplifier for a given bit line or group of bit lines may directly control the bit line(s). In data reading, the read/write circuits 360 may apply a strobe signal to a given sense amplifier. The sense amplifier determines data at the assertion timing of the strobe signal (e.g., an ON state of a memory cell may be defined as data "0", and an off state may be defined as data "1"). This data may be held in an internal latch SADL of the sense amplifier before being transferred to one of the data latches 375 of the I/O buffer 332.

Input and output of data to and from the sense amplifiers 375 are performed via the data latches 335 of the I/O buffer 332. That is, data received from the storage controller 102 is transferred to sense amplifiers 375 via data latches 335. In addition, data in the sense amplifiers 375 (in internal latches of the sense amplifiers) is transmitted to the storage controller 102 via data latches 335. The data latches 335 of the I/O buffer 332 may function as the cache memory of the storage medium 104.

The control circuitry 310 cooperates with the read/write circuits 360 to perform memory operations (e.g., write, read, erase, and others) on the memory array 350. In some implementations, control circuitry 310 includes a state machine 312, an on-chip address decoder 314, a power control circuit 316, a temperature detection circuit 318, and/or ROM 320.

The state machine 312 provides die-level control of memory operations. In some implementations, the state machine 312 is programmable by software. In other implementations, the state machine 312 does not use software and is completely implemented in hardware (e.g., electrical circuits). In some implementations, the state machine 312 can be replaced by a microcontroller or microprocessor.

The address decoder 314 provides an address interface between addresses used by the host 106 or storage controller 102 to the hardware address used by the decoders 324 and 326.

The power control module 316 controls the power and voltages supplied to the word lines and bit lines during memory operations. It can include drivers for word line layers (discussed below) in a 3D configuration, select transistors (e.g., SGS and SGD transistors, described below) and source lines. Power control module 316 may include charge pumps for creating voltages.

The temperature detection circuit 318 may be configured to detect temperature in or around the storage medium 104. The temperature detection circuit 318 may include an on-chip temperature sensor.

The ROM 320 may be registers, ROM fuses, and/or other storage devices for storing default values such as base voltages, test data patterns for interface training, and/or other data or parameters.

Any one or any combination of control circuitry 310, state machine 312, decoders 314/324/326, temperature detection circuit 318, power control module 316, sense blocks 370, read/write circuits 360, and storage controller 102 can be considered one or more control circuits (or managing circuitry, or peripheral circuitry) that performs the functions described herein.

The memory array 350 may be addressable by word lines via a row decoder 324 and by bit lines via a column decoder 326. The memory array 350 may comprise one or more 2D or 3D arrays of memory cells. The memory array 350 may comprise a monolithic 3D memory array in which multiple memory levels are formed above (and not in) a single substrate, such as a wafer, with no intervening substrates. The memory array 350 may comprise any type of non-volatile memory that is monolithically formed in one or more physical levels of arrays of memory cells having an active area disposed above a silicon substrate. The memory array 350 may be in a non-volatile memory device having circuitry associated with the operation of the memory cells, whether the associated circuitry is above or within the substrate.

Multiple memory elements in memory array 350 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors. In some implementations, the non-volatile memory cells of memory array 350 comprise vertical NAND strings with charge-trapping material. In such a configuration, a NAND string includes memory cells connected by a channel.

A NAND flash memory array 350 may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three-dimensional memory array 350 may be arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three-dimensional memory array 350 may be vertically arranged as a stack of multiple two-dimensional memory device levels. As another nonlimiting example, a three-dimensional memory array 350 may be arranged as multiple vertical columns (e.g., columns extending substantially perpendicular to the major surface of the substrate, i.e., in the y direction) with each column having multiple memory cells. The vertical columns may be arranged in a two-dimensional configuration, e.g., in an x-y plane, resulting in a three-dimensional arrangement of memory cells, with memory cells on multiple vertically stacked memory planes. Other configurations of memory elements in three dimensions can also constitute a three-dimensional memory array.

By way of a non-limiting example, in a three-dimensional NAND memory array, the memory elements may be coupled together to form vertical NAND strings that traverse across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

In some implementations, the memory array 350 comprises a two dimensional memory array of non-volatile memory cells. In one example, the non-volatile memory cells are NAND flash memory cells utilize floating gates. Other types of memory cells (e.g., NOR-type flash memory) can also be used.

The exact type of memory array architecture or memory cells included in the memory array 350 is not limited to the examples above. Many different types of memory array architectures or memory cell technologies can be used to form the memory array 350. No particular non-volatile memory technology is required for purposes of the implementations described herein. Other examples of suitable technologies for memory cells of the memory array 350 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of the memory array 350 include two dimensional arrays, three dimensional arrays, cross-point arrays, stacked two dimensional arrays, vertical bit line arrays, and the like.

A person of ordinary skill in the art will recognize that the technology described herein is not limited to a single specific memory array, but covers many relevant memory arrays within the spirit and scope of the technology as described herein and as understood by one of ordinary skill in the art.

Figure 4:
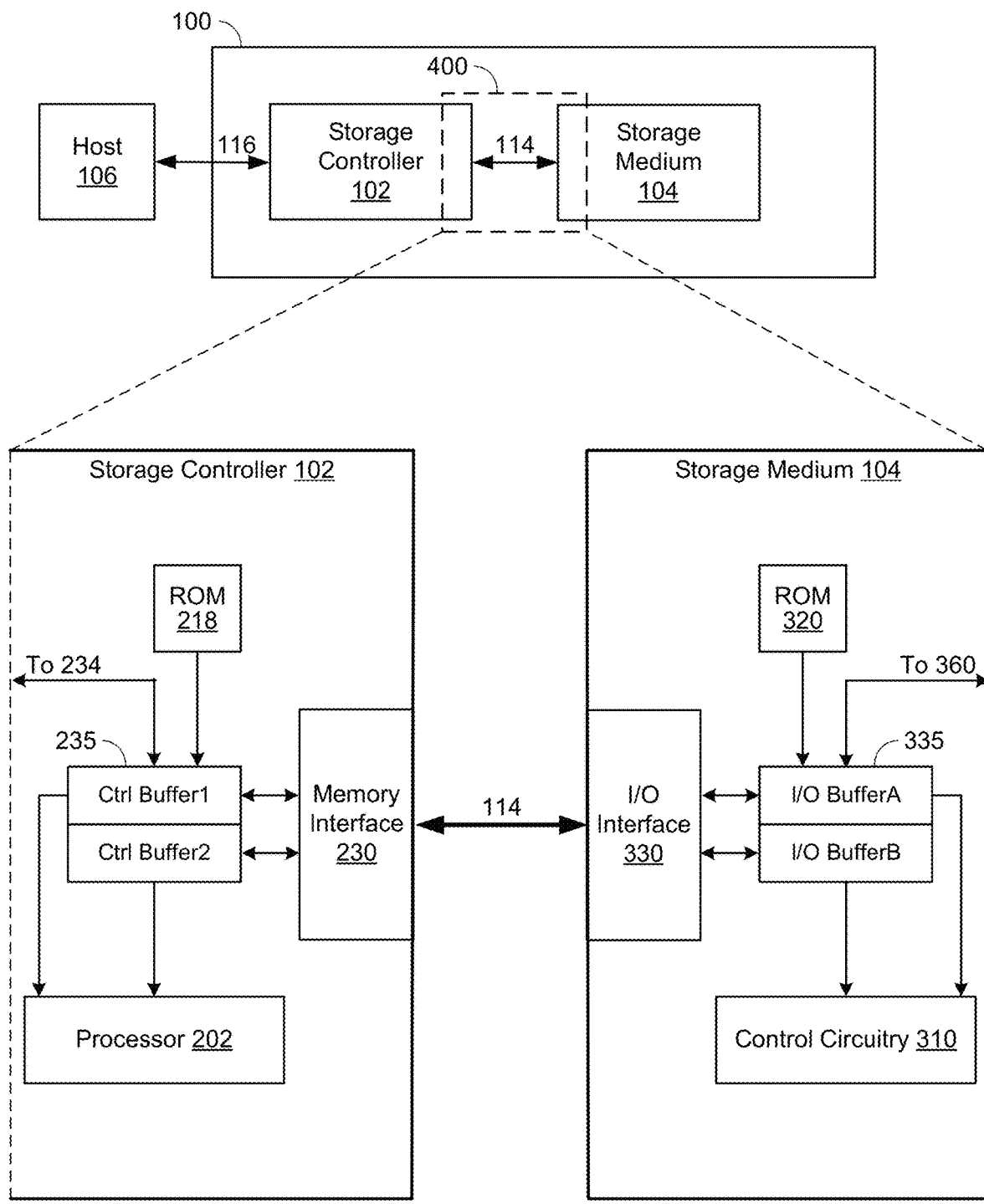
FIG. 4 is a functional block diagram of example interface circuitry of the storage system of FIG. 1 in accordance with some implementations.

FIG. 4 is a functional block diagram of example interface circuitry 400 of the storage system 100 in accordance with some implementations. The interface circuitry 400 connects the storage controller 102 and the storage medium(s) 104 in accordance with some implementations.

The interface circuitry 400 includes a channel 114 (also referred to as a bus), which includes data connections (also referred to as lines, signals, and/or wires). The data connections connect data and control signal pads of the storage medium interface 230 of the storage controller 102 with corresponding data and control signal pads of the I/O interface 330 of the storage medium 104.

The channel 114 transfers a plurality of data bits (e.g., an N-bit data bus including DQ0 through DQN data bits, where N is greater than or equal to 1), and various control signals (e.g., data strobe signals DQS/BDQS, signals RE/BRE, and optionally other control signals not shown or a subset of the control signals shown) between the storage controller 102 and the storage medium 104. Other combinations and subsets of data and control lines may be implemented without departing from the inventive concepts described herein.

Each side of the interface 400 includes buffers (also referred to as latches, or data latches) for the data connections.

During normal operation of the storage system 100, data being written from the storage controller 102 (encoded by encoder 234) to the storage medium 104 may be latched in a buffer (e.g., controller buffer1) of the storage controller 102 before being transmitted via the channel 114 to the storage medium 104, where the data may be latched in a buffer (e.g., I/O bufferA) of the storage medium 104 before being written to designated memory cells of the storage medium 104.

Likewise, data being read from the storage medium 104 may be latched in a buffer (e.g., I/O bufferA) of the storage medium 104 before being transmitted via the channel 114 to the storage controller 102, where the data may be latched in a buffer (e.g., controller buffer1) of the storage controller 102 before being decoded by decoder 234 and provided by the storage controller 102 to a host system 106.

During interface training (IFT), a test data pattern may be temporarily loaded into one or more control buffers 235 of the storage controller 102 (from local memory of the storage controller 102, such as ROM 218). The test data pattern may also be temporarily loaded into one or more I/O buffers 335 of the storage medium 104 (from local memory of the storage medium 104, such as ROM 320). Data transferred between the storage controller 102 and the storage medium 104 via the channel 114 may be compared to data stored in the respective buffers of the storage controller 102 and the storage medium 104. Throughout this disclosure, buffers (or latches) associated with the interface circuitry of the storage controller 102 are labeled buffer1, buffer2, and so forth. Likewise, buffers (or latches) associated with the interface circuitry of the storage medium 104 are labeled bufferA, bufferB, and so forth.

During IFT operations in which parameters are trained for transferring data from interface 330 of the storage medium 104 to interface 230 of the storage controller 102, the processor 202 (or other processing or control circuitry) of the storage controller 102 may compare the local version of the test data pattern (latched in buffer1) with successively obtained versions of the test data pattern transferred from the storage medium 104 via the interface channel 114 (latched in buffer2).

During IFT operations in which parameters are trained for transferring data from interface 230 of the storage controller 102 to interface 330 of the storage medium 104, control circuitry 310 of the storage medium 104 may compare the local version of the test data pattern (latched in bufferA) with successively obtained versions of the test data pattern transferred from the storage controller 102 via the interface channel 114 (latched in bufferB).

Figure 5A:
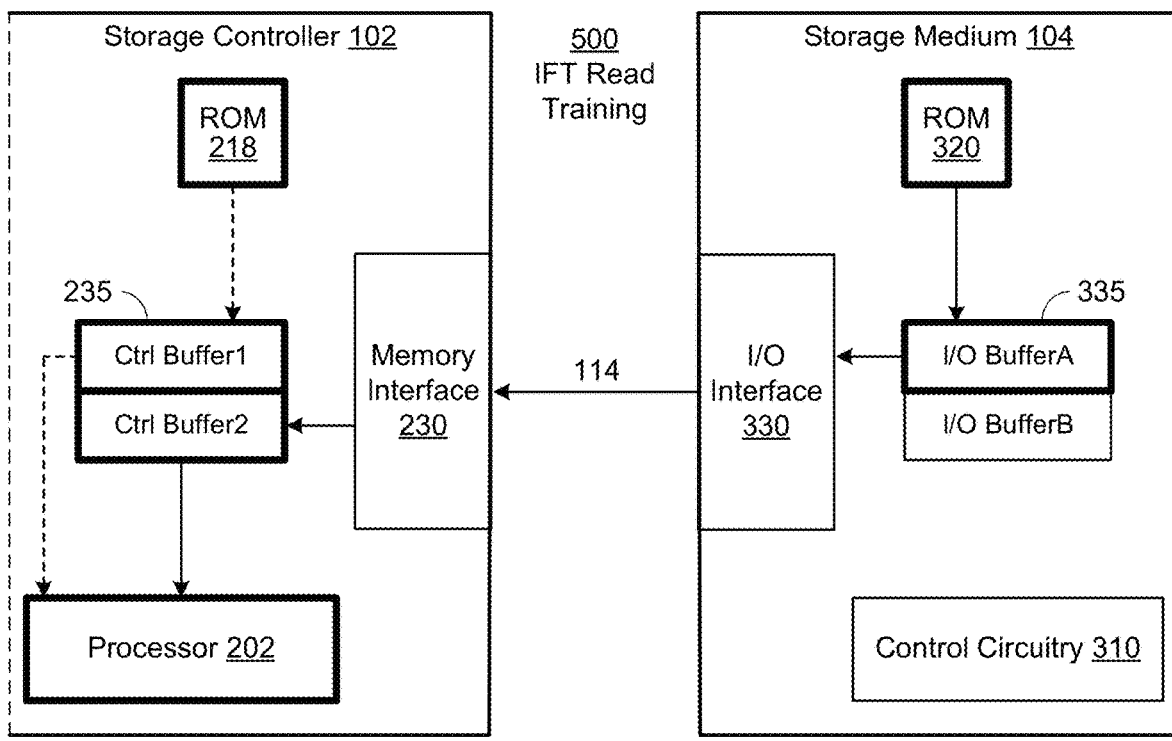
FIG. 5A is a block diagram of interface read training operations in accordance with some implementations.

FIG. 5A is a block diagram of interface read training operations 500 in accordance with some implementations. Interface read training operations are IFT operations in which parameters are trained for transferring data from interface 330 of the storage medium 104 to interface 230 of the storage controller 102. Such transfers of data at the interface are part of the data path for read operations during normal operation of the storage system 100.

To train the parameters for transferring data from the storage medium 104 to the storage controller 102 via interface channel 114 (referred to as interface read training), the processor 202 (or other processing/control logic of the storage controller 102) compares (i) a local copy or instance of a test data pattern latched in buffer1 with (ii) a copy or instance of the test data pattern transferred from the storage medium 104 and latched in buffer2.

The local instance of the test data pattern in buffer1 may be stored in local memory of the storage controller 102, such as in ROM 218, and latched in buffer1 in accordance with IFT operations. More specifically, the local instance of the test data pattern exists in ROM 218 (or other local memory in the storage controller 102) prior to IFT operations, and is preloaded into buffer1 as an initial step in performing IFT operations.

The local instance of the test data pattern may be loaded into local memory of the storage controller 102 (e.g., into ROM 218) during manufacturing of the storage system 100 or through a special test mode. In some implementations, the test data pattern may be configured to attain a minimum balance of 0s and 1s for randomness and/or to account for signal interference. For implementations in which the test data pattern is loaded during manufacturing of the storage system 100, the same test data pattern is loaded into the storage controller 102 (e.g., in ROM 218) and in the storage medium 104 (e.g., in ROM 320), prior to IFT operations.

The transferred instance of the test data pattern in buffer2 may be initially stored in memory of the storage medium 104, such as in ROM 320, and transferred to the storage controller 102 by way of bufferA, I/O interface 330, and memory interface 230. The transferred instance of the test data pattern in buffer2 may be successively updated and compared to the local instance in buffer1 in accordance with successive IFT operations associated with different data transfer parameters.

Figure 5B:
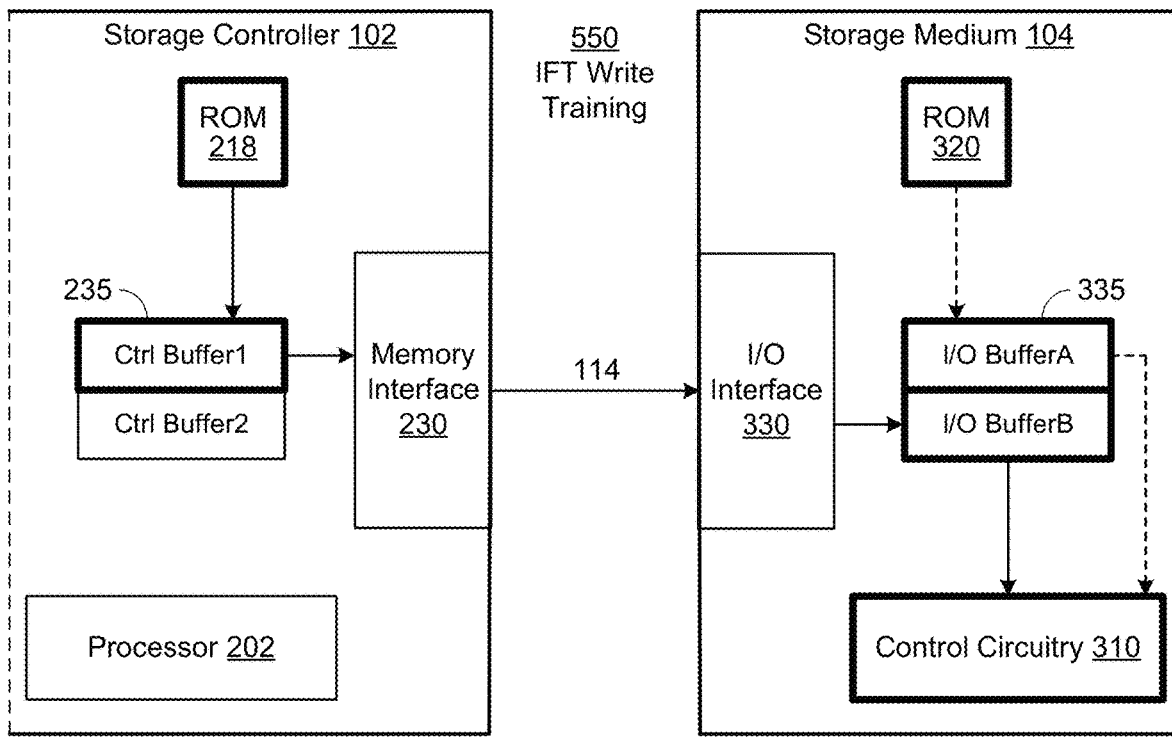
FIG. 5B is a block diagram of interface write training operations in accordance with some implementations.

FIG. 5B is a block diagram of interface write training operations (also referred to as program training operations) 550 in accordance with some implementations. Interface write training operations are IFT operations in which parameters are trained for transferring data from interface 230 of the storage controller 102 to interface 330 of the storage medium 104. Such transfers of data at the interface are part of the data path for write operations during normal operation of the storage system 100.

To train the parameters for transferring data from the storage controller 102 to the storage medium 104 via interface channel 114 (referred to as interface write training), the control circuitry 310 (or other processing/control logic of the storage medium 104) compares (i) a local copy or instance of a test data pattern latched in bufferA with (ii) a copy or instance of the test data pattern transferred from the storage controller 102 and latched in bufferB.

The local instance of the test data pattern in bufferA may be stored in local memory of the storage medium 104, such as in ROM 320, and latched in bufferA in accordance with IFT operations. More specifically, the local instance of the test data pattern exists in ROM 320 (or other local memory in the storage medium 104) prior to IFT operations, and is preloaded into bufferA as an initial step in performing IFT operations.

The local instance of the test data pattern may be loaded into local memory of the storage medium 104 (e.g., into ROM 320) during manufacturing of the storage system 100 or through a special test mode. In some implementations, the test data pattern may be configured to attain a minimum balance of 0s and 1s for randomness and/or to account for signal interference. For implementations in which the test data pattern is loaded during manufacturing of the storage system 100, the same test data pattern is loaded into the storage controller 102 (e.g., in ROM 218) and in the storage medium 104 (e.g., in ROM 320), prior to IFT operations. As such, when the storage medium 104 requires access to the test data pattern for use as a reference during IFT write training operations (e.g., described below with reference to operation 1064, FIG. 10), the storage medium 104 may access the test data pattern locally (by latching the test data pattern into bufferA from ROM 320) without being required to perform a relatively slow initial transfer of the test data pattern from the storage controller 102.

The preloading of the local instance of the test data pattern into bufferA may be executed in accordance with a command received from the storage controller 102 (described in more detail below with reference to operations 852 and 1052 in FIGS. 8 and 10, respectively).

The transferred instance of the test data pattern in bufferB may be initially stored in memory of the storage controller 102, such as in ROM 218, and transferred to the storage medium 104 by way of buffer1, memory interface 230, and I/O interface 330. The transferred instance of the test data pattern in bufferB may be successively updated and compared to the local instance in bufferA in accordance with successive IFT operations associated with different data transfer parameters.

FIG. 6 is a table 600 of interface transfer parameter sets for IFT operations and corresponding transfer error rates corresponding to the parameter sets. Each parameter set may include one or more timing and/or voltage parameters for controlling the transfer of data across the interface channel 114 between interface 230 of the storage controller 102 and interface 330 of the storage medium 104. The table 600 may be stored in memory of the storage controller 102 (e.g., in RAM 216 or ROM 218) and accessed by the processor 202 (or other processing or control circuitry of the storage controller 102) in setting interface transfer parameters for data transfer between interface 230 of the storage controller 102 and interface 330 of the storage medium 104. The values depicted in table 600 have been chosen for illustrative purposes and are nonlimiting.

During interface read training operations, the storage controller 102 performs successive data transfer operations (transferring a test data pattern from the storage medium 104 to the storage controller 102) using different parameter sets. For each operation/parameter set, the storage controller 102 records an error rate. The storage controller 102 continues to adjust the data transfer parameters until the error rate decreases to zero (or to a value below a threshold). The storage controller 102 may continue to adjust the data transfer parameters until the error rate begins to increase again. The storage controller 102 may determine a window 602 of parameter sets associated with no errors (or errors below a threshold), and a window center 604 associated with a parameter set in the middle of the window 602. As a result of the interface read training operations, data transfer operations involving data being transferred from interface 330 of the storage medium 104 to interface 230 of the storage controller 102 using the data transfer parameter set associated with the window center 604 are likely to result in no errors (or a number of errors below an acceptable threshold).

During interface write training operations, the storage controller 102 performs successive data transfer operations (transferring a test data pattern from the storage controller 102 to the storage medium 104) using different parameter sets. For each operation/parameter set, the storage controller 102 records an error rate. The storage controller 102 continues to adjust the data transfer parameters until the error rate decreases to zero (or to a value below a threshold). The storage controller 102 may continue to adjust the data transfer parameters until the error rate begins to increase again. The storage controller 102 may determine a window 602 of parameter sets associated with no errors (or errors below a threshold), and a window center 604 associated with a parameter set in the middle of the window 602. As a result of the interface write training operations, data transfer operations involving data being transferred from interface 230 of the storage controller 102 to interface 330 of the storage medium 104 using the data transfer parameter set associated with the window center 604 are likely to result in no errors (or a number of errors below an acceptable threshold).

As performance of the data storage system 100 increases, transfer speeds at the interface 400 must also increase. To support higher interface speeds, adjustments to IFT may be implemented as described below with reference to FIGS. 7-10.

Figure 7:
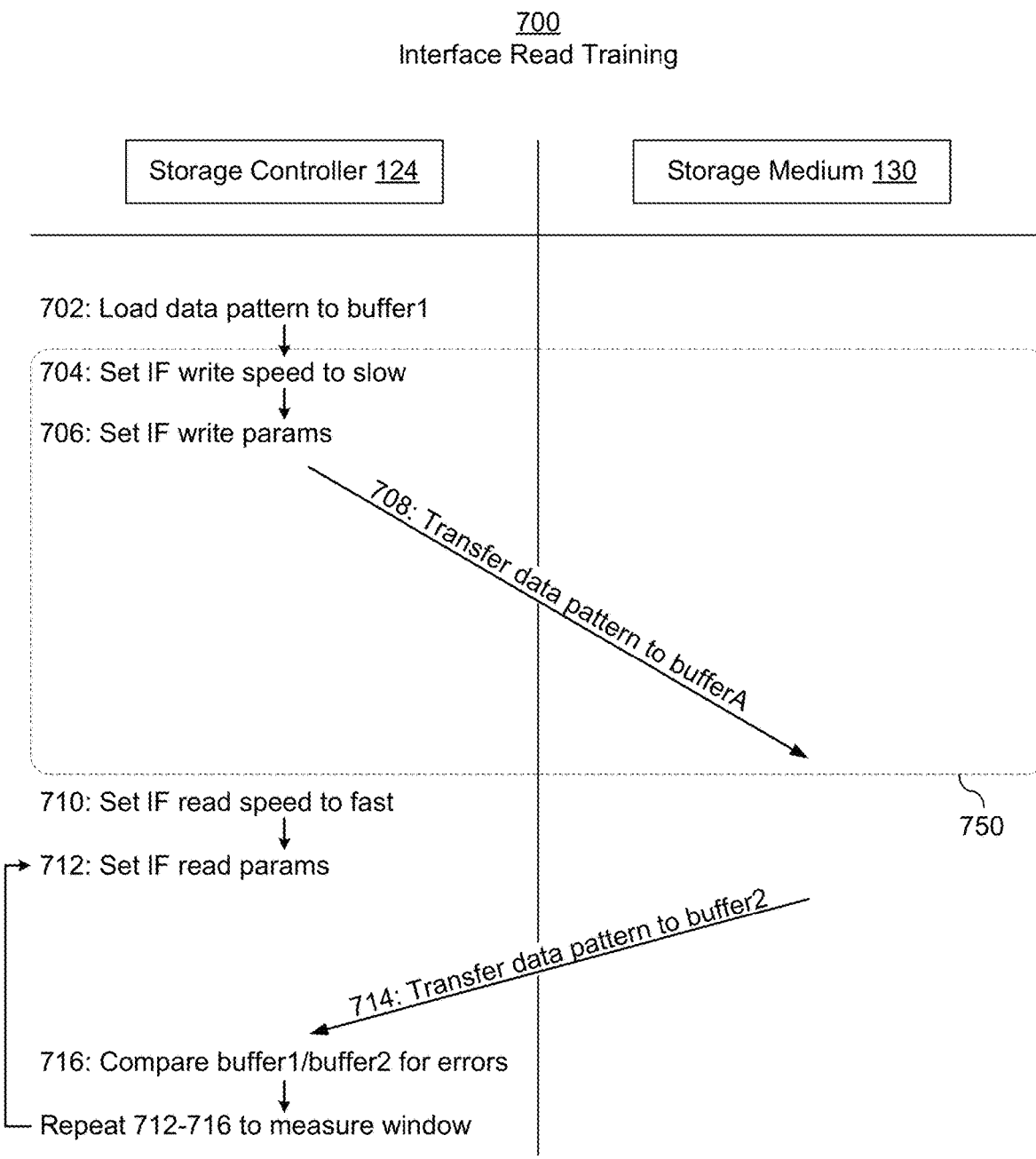
FIG. 7 is a flow diagram of an interface read training scheme in accordance with some implementations.

FIG. 7 is an interface read training scheme 700 in accordance with some implementations. The IFT scheme 700 may be at least partially implemented at interface circuitry 400 of a storage system 100. The IFT scheme 700 includes read training operations 702-716.

During IFT for read transfers, the storage controller 102 transfers data to the storage medium 104 at a transfer speed that is low enough that the data can be assumed to have been transferred with no errors. The storage controller 102 successively reads the data from the storage medium 104 at faster and faster speeds, and with differing interface transfer parameters (e.g., voltage times and levels). With each successive read operation, the storage controller 102 compares the data read from the storage medium 104 to a local copy of the data, and tracks the errors, thereby determining a window 602 of read parameters resulting in no errors (or below an acceptable threshold of errors).

Specifically, the read training operations begin when the storage controller 102 loads (702) a test data pattern into a first controller buffer (e.g., controller buffer1). The test data pattern may be any string of bits that is known to the storage controller 102 at the time of read training.

The test data pattern remains in the first controller buffer (e.g., buffer1) and is used as a reference during subsequent operations. For this operation, the test data pattern may be referred to as an instance of the test data pattern that is local to the storage controller. In other words, the storage controller has access to this instance of the test data pattern without requiring any data to be transferred from the storage medium.

The storage controller 102 proceeds to write the test data pattern to the storage medium 104. Specifically, the storage controller 102 sets (704) an interface write speed to a speed that is slow enough to ensure that the data will be written to the storage controller 102 without any errors (e.g., approximately 1-100 MB/sec). The storage controller 102 sets (706) one or more interface write parameters (e.g., voltage and/or timing values for performing write operations at the interface 400) to conservative values to ensure that the data will be written to the storage controller 102 without any errors.

In some implementations, operations 704 and 706 may be combined. In other words, the write speed may be one of the write parameters that is set or otherwise adjusted in operation 706.

Upon setting the interface write speed and interface write parameters, the storage controller 102 transfers (708) the test data pattern to a storage medium 104 buffer (e.g., I/O bufferA). At this point, the test data pattern is stored in the first controller buffer (buffer1) as a reference, and in the storage medium buffer (bufferA) for purposes of subsequent read training operations.

Upon having safely transferred the test data pattern to the storage medium 104, the storage controller 102 proceeds with IFT for different read parameters. Specifically, the storage controller 102 sets (710) the interface read speed to a relatively fast speed (e.g., approximately 1-10 GB/sec). The storage controller 102 sets (712) one or more interface read parameters (e.g., voltage and/or timing values for performing read operations at the interface 400) to first level(s) (e.g., a first read voltage threshold), referred to herein as a first parameter set.

In some implementations, operations 710 and 712 may be combined. In other words, the read speed may be one of the read parameters that is set or otherwise adjusted in operation 712.

The storage controller 102 transfers (714) the test data pattern from the storage medium 104 (e.g., from bufferA) to a second controller buffer in the storage controller 102 (e.g., to buffer2). Stated another way, the storage controller 102 reads the data stored in the storage medium 104 (bufferA) using the read parameters that were configured in operation 712. At this point, the test data pattern is stored in two buffers at the storage controller 102—a first buffer (e.g., buffer1) serving as a reference buffer, and a second buffer (e.g., buffer2) serving as a test buffer.

The storage controller 102 compares (716) the data in the first controller buffer (buffer1, the reference data pattern) with the data in the second controller buffer (buffer2, the data pattern read from the storage medium) to determine an error rate. The storage controller 102 may determine the error rate by counting the number of positions in the respective data patterns that have different bits. For example, the storage controller 102 may perform an XOR operation on the data stored in the first controller buffer (buffer1, the reference data pattern) and the data stored in the second controller buffer (buffer2, the data pattern read from the storage medium) and count the number of resulting bits. The resulting bit count represents the number of errors.

Upon determining the error rate for the first read parameter set, the storage controller 102 repeats operations 712-716 with modified read parameters. Specifically, the storage controller 102 adjusts the one or more interface read parameters, setting (712) the read parameter(s) to second level(s) (e.g., increasing the read voltage level to a second level higher than the first), reads (714) the data pattern from the storage medium 104 (e.g., from bufferA) by transferring the data from the storage medium 104 (e.g., from bufferA) to the second storage controller 102 (e.g., to buffer2), and compares (716) the data pattern in the first controller buffer (buffer1) to the data pattern in the second controller buffer (buffer2) to determine an error rate for the modified read parameters.

The storage controller 102 repeats operations 712-716 for successive read parameter sets, stores the error rate for each parameter set (e.g., in table 600 in local memory at the storage controller 102), and determines a window 602 of read parameter sets for which the error rate is zero, or below a predetermined threshold. For successive parameter sets (e.g., 01 through 12 in table 600), an error rate is recorded. As a specific example, each successive parameter set may increase a read voltage ramp-up time for successive test reads (operation 714). The error rate may start relatively high, tend to zero, and then increase again. The parameter sets that result in no errors (or a number of errors below a predetermined threshold) may be referred to as a window 602.

The storage controller 102 may determine a window center 604 as the parameter set in the center of the window 602, and use the parameter set corresponding to the window center 604 for subsequent read operations involving the storage medium 104 for which the read training operations 702-716 were performed.

Figure 8:
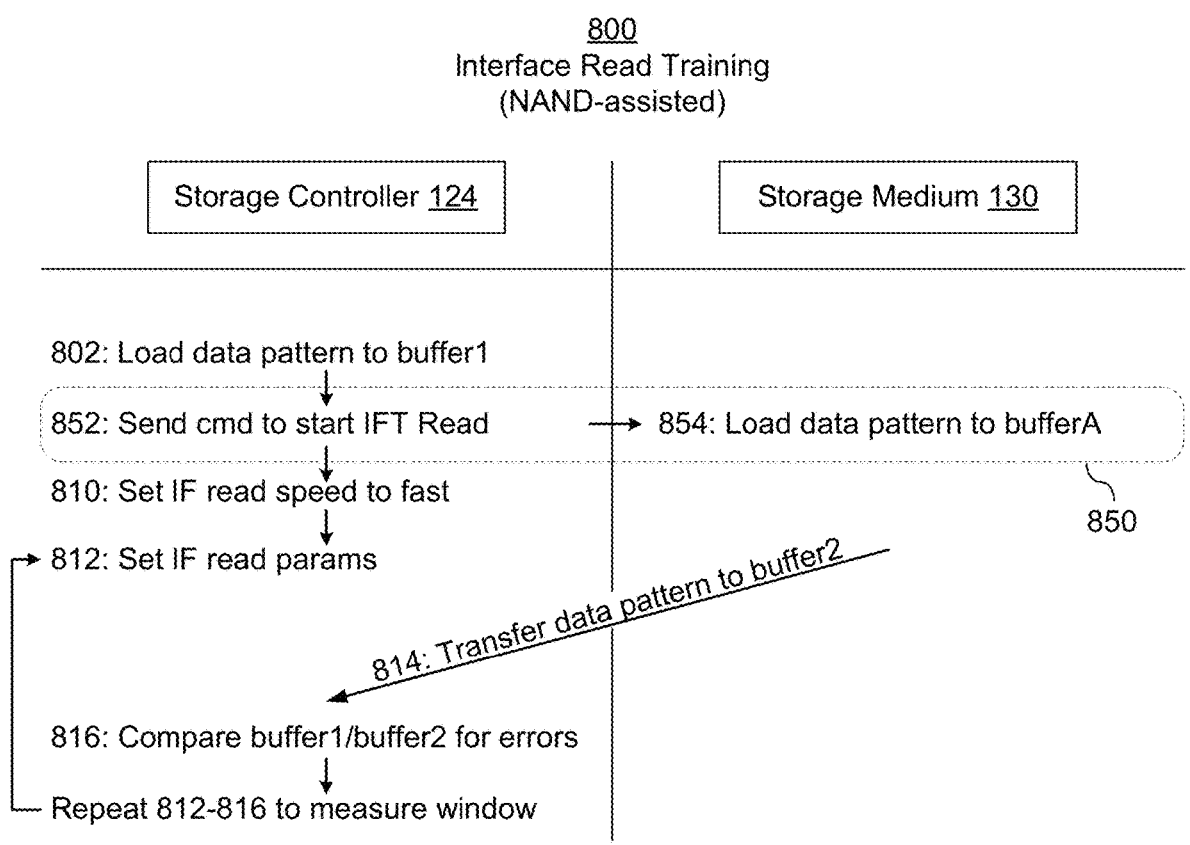
FIG. 8 is a flow diagram of a storage medium-assisted interface read training scheme in accordance with some implementations.

FIG. 8 is a storage medium-assisted interface read training scheme 800 in accordance with some implementations. The IFT scheme 800 may be at least partially implemented at interface circuitry 400 of a storage system 100. The IFT scheme 800 includes read training operations 802-854.

The IFT read scheme 800 leverages the storage medium 104 to perform some of the operations that the storage controller 102 performed in the IFT read scheme 700 (FIG. 7), thus making IFT more efficient. Specifically, the test data pattern may be stored in the storage medium 104 before IFT begins. The test data pattern may be preloaded to the storage medium 104 during manufacturing and/or configured prior to runtime. That way, rather than slowly writing the test data pattern to the storage medium 104 in operations 750 (FIG. 7), the storage controller 102 may command the storage medium 104 to quickly load the prestored test data pattern from on-board memory into a buffer (e.g., bufferA) in operations 850, which is much more efficient.

The storage controller 102 proceeds to successively read the data from the storage medium 104 (e.g., from bufferA) at faster and faster speeds, and with differing interface transfer parameters (e.g., voltage times and levels). With each successive read operation, the storage controller 102 compares the data read from the storage medium 104 to a local copy of the data (e.g., in buffer1), and tracks the errors, thereby determining a window 602 of read parameters resulting in no errors (or below an acceptable threshold of errors).

Specifically, the read training operations begin when the storage controller 102 loads (802) a test data pattern into a first controller buffer (e.g., controller buffer1). The test data pattern may be any string of bits that is known to the storage controller 102 at the time of read training. The test data pattern remains in the first controller buffer (buffer1) and is used as a reference during subsequent operations. For this operation, the test data pattern may be referred to as an instance of the test data pattern that is local to the storage controller. In other words, the storage controller has access to this instance of the test data pattern without requiring any data to be transferred from the storage medium.

The storage controller 102, rather than slowly writing the test data pattern to the storage medium 104 (as described above with reference to operations 750), instead sends a command (852) to the storage medium 104 to start IFT operations. As a result of receiving this command, the storage medium 104 loads (854) the pre-stored test data pattern from on-board memory (e.g., local storage at the storage medium 104) to a buffer (e.g., I/O bufferA). For this operation, the test data pattern may be referred to as an instance of the test data pattern that is local to the storage medium. In other words, the storage medium has access to this instance of the test data pattern without requiring any data to be transferred from the storage controller.

For implementations in which the storage device 120 includes a plurality of storage mediums 104, the storage controller 102 may broadcast the command in operation 852 to each storage medium 104 in parallel. As a result, each storage medium 104 may internally load the test data pattern to a respective buffer (e.g., bufferA) at the same time, thereby saving even more time.

Once the test data pattern is loaded into (i) the first controller buffer at the storage controller 102 (e.g., buffer1) and (ii) the buffer at the storage medium 104 (e.g., bufferA), the storage controller 102 proceeds with IFT for different read parameters. Specifically, the storage controller 102 sets (810) the interface read speed to a relatively fast speed (e.g., approximately 1-10 GB/sec).

Next, the storage controller 102 sets (812) one or more interface read parameters (e.g., voltage and/or timing values for performing read operations at the interface 400) to first level(s) (e.g., a first read voltage threshold), referred to herein as a first parameter set.

In some implementations, operations 810 and 812 may be combined. In other words, the read speed may be one of the read parameters that is set or otherwise adjusted in operation 812.

The storage controller 102 transfers (814) the test data pattern from the storage medium 104 (e.g., from bufferA) to a second controller buffer in the storage controller 102 (e.g., to buffer2). Stated another way, the storage controller 102 reads the data stored in the storage medium 104 (bufferA) using the read parameters that were configured in operation 812. At this point, the test data pattern is stored in two buffers at the storage controller 102—a first buffer (e.g., buffer1) serving as a reference buffer, and a second buffer (e.g., buffer2) serving as a test buffer.

The storage controller 102 compares (816) the data in the first controller buffer (buffer1, the reference data pattern) with the data in the second controller buffer (buffer2, the data pattern read from the storage medium) to determine an error rate. The storage controller 102 may determine the error rate by counting the number of positions in the respective data patterns that have different bits. For example, the storage controller 102 may perform an XOR operation on the data stored in the first controller buffer (buffer1, the reference data pattern) and the data stored in the second controller buffer (buffer2, the data pattern read from the storage medium) and count the number of resulting bits. The resulting bit count represents the number of errors.

Upon determining the error rate for the first read parameter set, the storage controller 102 repeats operations 812-816 with modified read parameters. Specifically, the storage controller 102 adjusts the one or more interface read parameters, setting (812) the read parameter(s) to second level(s) (e.g., increasing the read voltage level to a second level higher than the first), reads (814) the data pattern from the storage medium 104 (e.g., from bufferA) by transferring the data from the storage medium 104 (e.g., from bufferA) to the second storage controller 102 (e.g., to buffer2), and compares (816) the data pattern in the first controller buffer (buffer1) to the data pattern in the second controller buffer (buffer2) to determine an error rate for the modified read parameters.

The storage controller 102 repeats operations 812-816 for successive read parameter sets, stores the error rate for each parameter set (e.g., in table 600 in local memory at the storage controller 102), and determines a window 602 of read parameter sets for which the error rate is zero, or below a predetermined threshold. For successive parameter sets (e.g., 01 through 12 in table 600), an error rate is recorded. As a specific example, each successive parameter set may increase a read voltage ramp-up time for successive test reads (operation 814). The error rate may start relatively high, tend to zero, and then increase again. The parameter sets that result in no errors (or a number of errors below a predetermined threshold) may be referred to as a window 602. The storage controller 102 may determine a window center 604 as the parameter set in the center of the window 602, and use the parameter set corresponding to the window center 604 for subsequent read operations involving the storage medium 104 for which the read training operations 802-854 were performed.

The storage medium-assisted IFT scheme 800 (also referred to as a NAND-assisted IFT scheme) leverages scenarios in which the storage medium 104 has access to the test data pattern prior to IFT. Example scenarios include manufacturing processes in which the storage controller 102 and the storage medium 104 are configured to store the same test data pattern for IFT. In such scenarios, the storage controller 102 is not required to slowly write the test data pattern to the storage medium 104 as described above with reference to operations 750 (FIG. 7). Writing the test data pattern using operations 750 may take hundreds of microseconds (μs) per die (per storage medium 104). For a storage device having, for example, 256 dies, the write operations 750 may take on the order of milliseconds (ms) to be performed. If these operations must be performed while the storage device 120 is being powered on, or while performing drive manufacturing, IFT can be very inefficient.

Sending a command to the storage medium 104 to have the storage medium 104 load a pre-stored version of the test data pattern (operations 850), on the other hand, may take only several μs. This way, the storage medium 104 can automatically load the test data pattern without the need to slowly transfer the test data pattern in from the storage controller 102. Compared to the hundreds of μs required to slowly transfer the test data pattern in (operations 750), operations 850 provide a considerable increase in IFT efficiency by reducing the amount of time required to perform read training.

Figure 9:
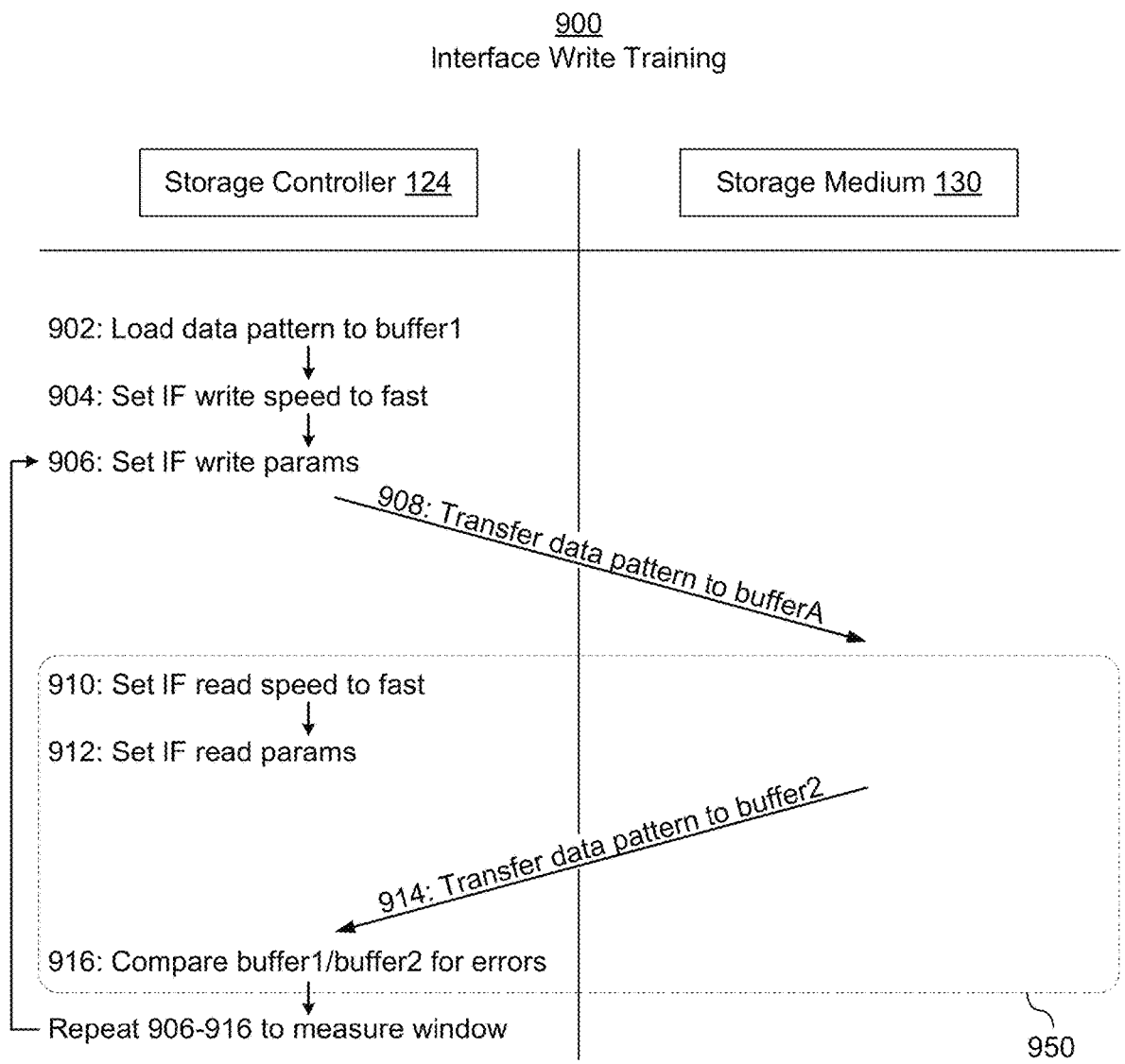
FIG. 9 is a flow diagram of an interface write training scheme in accordance with some implementations.

FIG. 9 is an interface write training scheme 900 in accordance with some implementations. The IFT scheme 900 may be at least partially implemented at interface circuitry 400 of a storage system 100. The IFT scheme 900 includes program training operations 902-916 (also referred to as write training operations).

During IFT for write transfers, the storage controller 102 successively writes data to the storage medium 104 at faster and faster speeds, and with differing interface transfer parameters (e.g., voltage times and levels). With each successive write operation, the storage controller 102 subsequently reads the data from the storage medium 104 and compares the data read from the storage medium 104 to a local copy of the data, and tracks the errors, thereby determining a window of write parameters resulting in no errors (or below a predetermined threshold of errors). If IFT read operations are performed before IFT write operations, the read operation during write IFT may be quickly performed using read parameters that were obtained during the previous IFT read operations (in the window of read parameters resulting in no errors).

Specifically, the write training operations begin when the storage controller 102 loads (902) a test data pattern into a first controller buffer (e.g., controller buffer1). The test data pattern may be any string of bits that is known to the storage controller 102 at the time of read training. The test data pattern remains in the first controller buffer (e.g., buffer1) and is used as a reference during subsequent operations. For this operation, the test data pattern may be referred to as an instance of the test data pattern that is local to the storage controller. In other words, the storage controller has access to this instance of the test data pattern without requiring any data to be transferred from the storage medium.

The storage controller 102 proceeds to write the test data pattern to the storage medium 104. Specifically, the storage controller 102 sets (904) an interface write speed to a fast speed. For example, the storage controller 102 sets the interface write speed to a speed at which write operations will be performed during normal operation of the data storage system 100 (e.g., 800 MB/s, 1 GB/s, 2 GB/s, or any other operational speed).

Next, the storage controller 102 sets (906) one or more interface write parameters (e.g., voltage and/or timing values for performing write operations at the interface 400) to a first set of values (e.g., parameter set 01 in table 600, FIG. 6).

In some implementations, operations 904 and 906 may be combined. In other words, the write speed may be one of the write parameters that is set or otherwise adjusted in operation 906.

Upon setting the interface write speed and interface write parameters, the storage controller 102 transfers (908) the test data pattern to a storage medium buffer (e.g., I/O bufferA). At this point, the test data pattern is stored in the first controller buffer (buffer1) in the storage controller 102 as a reference, and in the storage medium buffer (bufferA) in the storage medium 104 for purposes of subsequent write training operations.

Upon having transferred the test data pattern to the storage medium 104, the storage controller 102 proceeds by transferring the test data back to the storage controller 102 at a safe speed (a speed at which it may be assumed that no errors will occur) in order to compare the test data pattern (the data written to bufferA in the storage medium 104) to the reference data pattern (the data stored in buffer1 in the storage controller 102).

If read training operations were conducted prior to the write training operations 900, then the storage controller 102 sets (910) the read speed and sets (912) the read parameters to those determined to be optimal during the read training operations (e.g., parameters associated with the window center 604). Stated another way, the write training operations 900 are performed subsequent to read training operations (e.g., 700 or 800), then read speed and parameter values have already been optimized, and read operations (e.g., 914) during write training may be executed using optimal speeds and parameters. In some implementations, operations 910 and 912 may be combined. In other words, the read speed may be one of the read parameters that is set or otherwise adjusted in operation 912.

However, if read training operations were not conducted prior to the write training operations 900, then the storage controller 102 sets the read speed and read parameters to slow and conservative values in order to ensure no errors are incurred while reading the test data from the storage medium 104.

Using the speed and parameters set in operations 910 and 912, the storage controller 102 reads the test data pattern from the storage medium 104. Specifically, the storage controller 102 transfers (914) the test data pattern from the storage medium 104 (e.g., from bufferA) to a second controller buffer in the storage controller 102 (e.g., to buffer2). At this point, the test data pattern is stored in two buffers at the storage controller 102—the first controller buffer (buffer1) serving as a reference buffer, and the second controller buffer (buffer2) serving as a test buffer.

The storage controller 102 compares (916) the data in the first controller buffer (buffer1, the reference data pattern) with the data in the second controller buffer (buffer2, the data pattern read from the storage medium) to determine an error rate. The storage controller 102 may determine the error rate by counting the number of positions in the respective data patterns that have different bits. For example, the storage controller 102 may perform an XOR operation on the data stored in the first controller buffer (buffer1, the reference data pattern) and the data stored in the second controller buffer (buffer2, the data pattern read from the storage medium) and count the number of resulting bits. The resulting bit count represents the number of errors.

Upon determining the error rate for the first write parameter set (set in operation 906), the storage controller 102 repeats operations 906-916 with modified read parameters. Specifically, the storage controller 102 adjusts the one or more interface write parameters, setting (906) the write parameter(s) to second level(s) (e.g., increasing the write voltage level to a second level higher than the first), writes (908) the data pattern to the storage medium 104 (e.g., to bufferA) by transferring the data from the storage controller 102 (e.g., from buffer1) to the storage medium 104 (e.g., to bufferA), reads (914) the data stored in the storage medium 104 (e.g., in bufferA) by transferring the data from the storage medium 104 (bufferA) to the second controller buffer (buffer2), and determines (916) an error rate for the modified write parameters.

The storage controller 102 repeats operations 906-916 for successive write parameter sets (successively adjusted in operation 906), stores the error rate for each parameter set (e.g., in table 600 in local memory at the storage controller 102), and determines a window 602 of write parameter sets for which the error rate is zero, or below a predetermined threshold. For successive parameter sets (e.g., 01 through 12 in table 600), an error rate is recorded. As a specific example, each successive parameter set may increase a write voltage window size for successive test writes (operation 906). The error rate may start relatively high, tend to zero, and then increase again. The parameter sets that result in no errors (or a number of errors below a predetermined threshold) may be referred to as a window 602. The storage controller 102 may determine a window center 604 as the parameter set in the center of the window 602, and use the parameter set corresponding to the window center 604 for subsequent write operations involving the storage medium 104 for which the write training operations 902-916 were performed.

Figure 10:
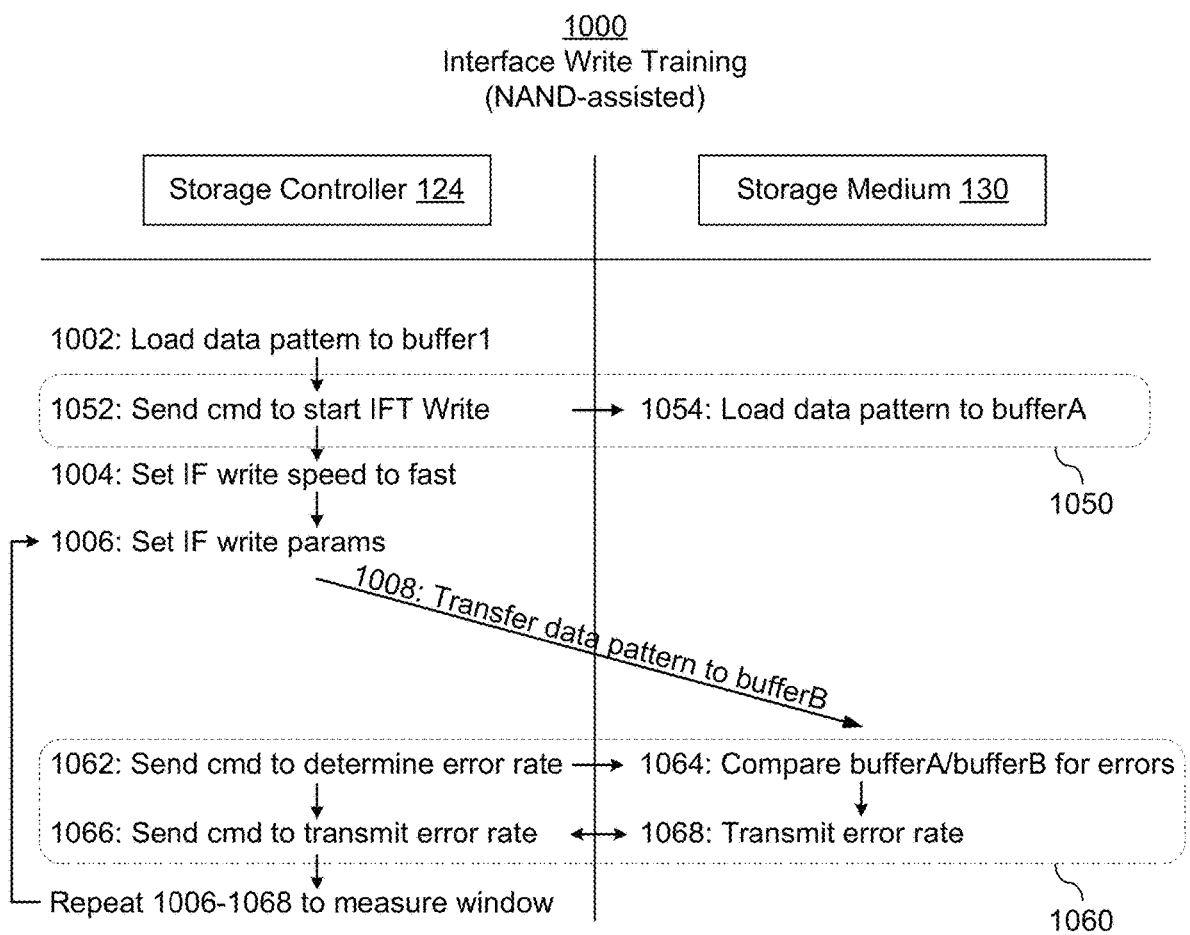
FIG. 10 is a flow diagram of an storage medium-assisted interface write training scheme in accordance with some implementations.

FIG. 10 is an storage medium-assisted interface write training scheme 1000 in accordance with some implementations. The IFT scheme 1000 may be at least partially implemented at interface circuitry 400 of a storage system 100. The IFT scheme 1000 includes program training operations 1002-1066 (also referred to as write training operations).

The IFT write scheme 1000 leverages the storage medium 104 to perform some of the operations that the storage controller 102 performed in the IFT write scheme 900 (FIG. 9), thus making IFT more efficient. Specifically, the test data pattern may be stored in the storage medium 104 before IFT begins. The test data pattern may be preloaded to the storage medium 104 during manufacturing and/or configured prior to runtime. That way, rather than storage controller 102 having to read back the written test data pattern in operations 950 (FIG. 9) to evaluate errors for each successive round of IFT, the storage medium 104 may perform the error evaluation instead in operations 1060, which is much more efficient.

The storage controller 102 proceeds to successively write data to the storage medium 104 at faster and faster speeds, and with differing interface transfer parameters (e.g., voltage times and levels). With each successive write operation, the storage medium 104 compares the data written by the storage controller 102 with a local copy of the data, and tracks the errors, thereby determining a window of write parameters resulting in no errors (or below a predetermined threshold of errors).

Specifically, the write training operations begin when the storage controller 102 loads (1002) a test data pattern into a first controller buffer (e.g., controller buffer1). The test data pattern may be any string of bits that is known to the storage controller 102 at the time of read training.

The test data pattern remains in the first controller buffer (e.g., buffer1) and is used as a reference during subsequent operations. For this operation, the test data pattern may be referred to as an instance of the test data pattern that is local to the storage controller. In other words, the storage controller has access to this instance of the test data pattern without requiring any data to be transferred from the storage medium.

The storage controller 102 sends a command (1052) to the storage medium 104 to start IFT operations. As a result of receiving this command, the storage medium 104 loads (1054) the pre-stored test data pattern from on-board memory (e.g., local storage at the storage medium 104) to a first storage medium buffer (e.g., I/O bufferA). For this operation, the test data pattern may be referred to as an instance of the test data pattern that is local to the storage medium. In other words, the storage medium has access to this instance of the test data pattern without requiring any data to be transferred from the storage controller.

For implementations in which the storage device 120 includes a plurality of storage mediums 104, the storage controller 102 may broadcast the command in operation 1052 to each storage medium 104 in parallel. As a result, each storage medium 104 may internally load the test data pattern (instances of the test data pattern that are local to each respective storage medium) to a respective buffer (e.g., bufferA) at the same time, thereby saving even more time.

Once the test data pattern is loaded into (i) the first controller buffer at the storage controller 102 (e.g., buffer1) and (ii) the first storage medium buffer at the storage medium 104 (e.g., bufferA), the storage controller 102 proceeds to write the test data pattern to the storage medium 104. Specifically, the storage controller 102 sets (1004) an interface write speed to a fast speed. For example, the storage controller 102 sets the interface write speed to a speed at which write operations will be performed during normal operation of the data storage system 100 (e.g., 800 MB/s, 1 GB/s, 2 GB/s, or any other operational speed).

Next, the storage controller 102 sets (1006) one or more interface write parameters (e.g., voltage and/or timing values for performing write operations at the interface 400) to a first set of values (e.g., parameter set 01 in table 600, FIG. 6).

In some implementations, operations 1004 and 1006 may be combined. In other words, the write speed may be one of the write parameters that is set or otherwise adjusted in operation 1006.

Upon setting the interface write speed and interface write parameters, the storage controller 102 transfers (1008) the test data pattern to a second storage medium buffer (e.g., I/O bufferB). Stated another way, the storage controller 102 writes the test data pattern to the storage medium 104 (to bufferB). At this point, the test data pattern is stored in the first storage medium buffer (bufferA) as a reference, and in the second storage medium buffer (bufferB) for testing the accuracy of the transfer/write operation 1008.

Upon having transferred the test data pattern to the storage medium 104, the storage controller 102 sends a first command (1062) to the storage medium 104 to determine an error rate (count the errors) of the test data pattern that was written to the second storage medium buffer (bufferA) in operation 1008, when compared to the reference test pattern in the first storage medium buffer (bufferA), thereby testing the accuracy of the transfer/write operation 1008.

Upon receiving the first command, the storage medium 104 compares (1064) the data in the first storage medium buffer (bufferA, the reference data pattern) with the data in the second storage medium buffer (bufferA, the data pattern written to the storage medium) to determine an error rate. The storage medium 104 may determine the error rate by counting the number of positions in the respective data patterns that have different bits. For example, the storage medium 104 may perform an XOR operation on the data stored in the first storage medium buffer (bufferA, the reference data pattern) and the data stored in the second storage medium buffer (bufferB, the data pattern written to the storage medium) and count the number of resulting bits (e.g., by performing a bitscan of the result of the XOR operation). The resulting bit count represents the number of errors. The storage medium 104 may set an error status (e.g., as a value in a register) associated with the number of errors.

In some implementations, rather than determining the error rate (operation 1064) as a result of receiving a command from the storage controller 102 (operation 1062), the storage medium 104 may determine the error rate automatically upon receiving the written data (operation 1008) in the second storage medium buffer (bufferB), thereby eliminating the need for operation 1062.

The storage controller 102 may proceed by sending a second command (1066) to the storage medium 104, instructing the storage medium 104 to transmit the error rate that was determined in operation 1064 (e.g., to transmit the error status) to the storage controller 102. The storage medium 104 transmits (1068) the error rate determined in operation 1064 in response to receiving the second command (operation 1066) from the storage controller 102.

In some implementations, rather than sending the error rate (operation 1068) as a result of receiving a command from the storage controller 102 (operation 1066), the storage medium 104 may transmit the error rate to the storage controller 102 automatically upon determining the error rate in operation 1064, thereby eliminating the need for operation 1066.

Upon receiving the error rate for the first write parameter set (set in operation 1006) from the storage medium 104, the storage controller 102 and storage medium 104 respectively repeat operations 1006-1068 with modified write parameters. Specifically, the storage controller 102 adjusts the one or more interface write parameters, setting (1006) the write parameter(s) to second level(s) (e.g., increasing the write voltage level to a second level higher than the first), writes (1008) the data pattern to the storage medium 104 (e.g., to bufferB) by transferring the data pattern from the storage controller 102 (e.g., from buffer1) to the storage medium 104 (e.g., to bufferB), commands (1062) the storage medium 104 to determine an error rate for the modified write parameters (resulting in the storage medium 104 performing operation 1064), and commands (1066) the storage medium 104 to transmit the error rate for the modified write parameters to the storage controller 102 (resulting in the storage medium 104 performing operation 1066).

The storage controller 102 and storage medium 104 respectively repeat operations 1006-1068 for successive write parameter sets (successively adjusted in operation 1006). The storage controller 102 stores the error rate for each parameter set (e.g., in table 600 in local memory at the storage controller 102), and determines a window 602 of write parameter sets for which the error rate is zero, or below a predetermined threshold.

For successive parameter sets (e.g., 01 through 12 in table 600), an error rate is recorded. As a specific example, each successive parameter set may increase a write voltage window size for successive test writes (operation 906). The error rate may start relatively high, tend to zero, and then increase again. The parameter sets that result in no errors (or a number of errors below a predetermined threshold) may be referred to as a window 602. The storage controller 102 may determine a window center 604 as the parameter set in the center of the window 602, and use the parameter set corresponding to the window center 604 for subsequent write operations involving the storage medium 104 for which the write training operations 1002-1068 were performed.

The storage medium-assisted IFT scheme 1000 (also referred to as a NAND-assisted IFT scheme) leverages scenarios in which the storage medium 104 has access to the test data pattern prior to IFT. Example scenarios include manufacturing processes in which the storage controller 102 and the storage medium 104 are configured to store the same test data pattern for IFT. In such scenarios, the storage controller 102 is not required to read back the written test data from the storage medium 104 in order to determine an error rate as described above with reference to operations 950 (FIG. 9). Reading the written test data pattern using operations 950 may add significant delay to IFT (e.g., 30-50 µs per parameter set). For example, testing 10 parameter sets may cause a delay of close to 1 ms per storage medium 104. If IFT operations must be performed while the storage device 120 is being powered on, or while performing drive manufacturing, IFT can be very inefficient with these delays.

Sending commands to the storage medium 104 to have the storage medium 104 (i) load a pre-stored version of the test data pattern (operations 1050), and (ii) perform the error rate determination (operations 1060), on the other hand, requires much less time than required by operations 950. This way, the storage medium 104 can automatically load the test data pattern and perform the error rate determinations for each parameter set without the need to transfer the test data pattern back out to the storage controller 102. Compared to the amount of time required to transfer the test data pattern back out to the storage controller 102 (operations 950), operations 1050 and 1060 provide a considerable increase in IFT efficiency by reducing the amount of time required to perform write training.

As described above, the storage medium-assisted IFT schemes 800 and 1000 implement unidirectional training, meaning the test data pattern is transferred (i) in only one direction for read training (from the storage medium 104 to the storage controller 102) and (ii) in only one direction for write training (from the storage controller 102 to the storage medium 104). Such unidirectional training is more efficient than the bidirectional training that is performed in IFT schemes 700 and 900, in which the test data pattern is transferred in two directions (from the storage medium 104 to the storage controller 102, and from the storage controller 102 to the storage medium 104) for both read training and write training. Thus, leveraging the storage medium 104 as described above with reference to FIGS. 8 and 10, the time required to perform IFT for read and write training can be reduced.

It will be appreciated by those skilled in the art that changes could be made to the exemplary embodiments shown and described above without departing from the broad inventive concept thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention, different components as opposed to those specifically mentioned may perform at least some of the features described herein, and features of the disclosed embodiments may be combined. As used herein, the terms "about" and "approximately" may refer to + or −10% of the value referenced. For example, "about 9" is understood to encompass 8.2 and 9.9.

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

It will be understood that, although the terms "first," "second," etc. are sometimes used herein to describe various elements, these elements should not be limited by these terms. These terms are only used to distinguish one element from another. For example, a first element could be termed a second element, and, similarly, a second element could be termed a first element, without changing the meaning of the description, so long as all occurrences of the "first element" are renamed consistently and all occurrences of the second element are renamed consistently. The first element and the second element are both elements, but they are not the same element.

As used herein, the term "if" may be, optionally, construed to mean "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, operations, elements, and/or components, but do not preclude the presence or addition of one or more other features, integers, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

Further, to the extent that the method does not rely on the particular order of steps set forth herein, the particular order of the steps should not be construed as limitation on the claims. The claims directed to the method of the present invention should not be limited to the performance of their steps in the order written, and one skilled in the art can readily appreciate that the steps may be varied and still remain within the spirit and scope of the present invention.

What is claimed is:

1. A data storage system, comprising:
a storage medium including a plurality of memory cells;
a storage controller in communication with the storage medium;
an electrical interface configured to transfer data via a channel disposed between first interface circuitry in the storage controller and second interface circuitry in the storage medium;
wherein the storage controller and the storage medium are configured to perform interface training operations at the first interface circuitry and the second interface circuitry, the interface training operations including:
loading a test data pattern from local memory of the storage controller into a first controller buffer of the storage controller;
loading the test data pattern from local memory of the storage medium into a first storage medium buffer of the storage medium; and
at the storage controller:
setting a first read voltage or timing parameter;
transferring the test data pattern from the first storage medium buffer to a second controller buffer of the storage controller using the first read voltage or timing parameter;
comparing, as a first comparison, (i) the test data pattern in the first controller buffer with (ii) the test data pattern in the second controller buffer;
determining a first read transfer error rate based on the first comparison; and
setting a runtime read voltage or timing parameter to the first read voltage or timing parameter based on a determination that the first read transfer error rate is below a predetermined read transfer error rate threshold.

2. The data storage system of claim 1, wherein the interface training operations further include:
at the storage controller:
setting a second read voltage or timing parameter different from the first read voltage or timing parameter;
transferring the test data pattern from the first storage medium buffer to the second controller buffer using the second read voltage or timing parameter;
comparing, as an updated first comparison, (i) the test data pattern in the first controller buffer with (ii) the test data pattern in the second controller buffer; and
determining a second read transfer error rate based on the updated first comparison.

3. The data storage system of claim 2, wherein the interface training operations further include:
at the storage controller:

determining, as a first determination, that the first read transfer error rate is lower than the second read transfer error rate; and
setting the runtime read voltage or timing parameter to the first read voltage or timing parameter based on the first determination.

4. The data storage system of claim 1, wherein the interface training operations further include:
at the storage controller:
setting a first write voltage or timing parameter; and
transferring the test data pattern from the first controller buffer to a second storage medium buffer of the storage medium using the first write voltage or timing parameter; and
at the storage medium:
comparing, as a second comparison, (i) the test data pattern in the first storage medium buffer with (ii) the test data pattern in the second storage medium buffer;
determining a first write transfer error rate based on the second comparison; and
transmitting the first write transfer error rate to the storage controller.

5. The data storage system of claim 4, wherein the interface training operations further include:
at the storage controller:
setting a second write voltage or timing parameter different from the first write voltage or timing parameter; and
transferring the test data pattern from the first controller buffer to the second storage medium buffer using the second write voltage or timing parameter; and
at the storage medium:
comparing, as an updated second comparison, (i) the test data pattern in the first storage medium buffer with (ii) the test data pattern in the second storage medium buffer; and
determining a second write transfer error rate based on the updated second comparison; and
transmitting the second write transfer error rate to the storage controller.

6. The data storage system of claim 5, wherein the interface training operations further include:
at the storage controller:
determining, as a second determination, that the first write transfer error rate is lower than the second write transfer error rate or is below a predetermined write transfer error rate threshold; and
setting a runtime write voltage or timing parameter to the first write voltage or timing parameter based on the second determination.

7. The data storage system of claim 1, wherein:
prior to performing the interface training operations:
the local memory of the storage controller is preloaded with an instance of the test data pattern that is local to the storage controller; and
the local memory of the storage medium is preloaded with an instance of the test data pattern that is local to the storage medium; and
while performing the interface training operations:
loading the test data pattern into the first controller buffer includes loading the instance of the test data pattern that is local to the storage controller into the first controller buffer; and
loading the test data pattern into the first storage medium buffer includes loading the instance of the test data pattern that is local to the storage medium into the first storage medium buffer.

8. A method of performing interface training operations at a data storage system comprising a storage medium including a plurality of memory cells, a storage controller in communication with the storage medium, and an electrical interface configured to transfer data via a channel disposed between first interface circuitry in the storage controller and second interface circuitry in the storage medium, the method comprising:
loading a test data pattern from local memory of the storage controller into a first controller buffer of the storage controller;
loading the test data pattern from local memory of the storage medium into a first storage medium buffer of the storage medium; and
at the storage controller:
setting a first read voltage or timing parameter;
transferring the test data pattern from the first storage medium buffer to a second controller buffer of the storage controller using the first read voltage or timing parameter;
comparing, as a first comparison, (i) the test data pattern in the first controller buffer with (ii) the test data pattern in the second controller buffer;
determining a first read transfer error rate based on the first comparison; and
setting a runtime read voltage or timing parameter to the first read voltage or timing parameter based on a determination that the first read transfer error rate is below a predetermined read transfer error rate threshold.

9. The method of claim 8, further comprising:
at the storage controller:
setting a second read voltage or timing parameter different from the first read voltage or timing parameter;
transferring the test data pattern from the first storage medium buffer to the second controller buffer using the second read voltage or timing parameter;
comparing, as an updated first comparison, (i) the test data pattern in the first controller buffer with (ii) the test data pattern in the second controller buffer; and
determining a second read transfer error rate based on the updated first comparison.

10. The method of claim 9, further comprising:
at the storage controller:
determining, as a first determination, that the first read transfer error rate is lower than the second read transfer error rate; and
setting the runtime read voltage or timing parameter to the first read voltage or timing parameter based on the first determination.

11. The method of claim 8, further comprising:
at the storage controller:
setting a first write voltage or timing parameter; and
transferring the test data pattern from the first controller buffer to a second storage medium buffer of the storage medium using the first write voltage or timing parameter; and
at the storage medium:
comparing, as a second comparison, (i) the test data pattern in the first storage medium buffer with (ii) the test data pattern in the second storage medium buffer;
determining a first write transfer error rate based on the second comparison; and transmitting the first write transfer error rate to the storage controller.

12. The method of claim 11, further comprising:
at the storage controller:
setting a second write voltage or timing parameter different from the first write voltage or timing parameter; and
transferring the test data pattern from the first controller buffer to the second storage medium buffer using the second write voltage or timing parameter; and
at the storage medium:
comparing, as an updated second comparison, (i) the test data pattern in the first storage medium buffer with (ii) the test data pattern in the second storage medium buffer; and
determining a second write transfer error rate based on the updated second comparison; and
transmitting the second write transfer error rate to the storage controller.

13. The method of claim 12, further comprising:
at the storage controller:
determining, as a second determination, that the first write transfer error rate is lower than the second write transfer error rate or is below a predetermined write transfer error rate threshold; and
setting a runtime write voltage or timing parameter to the first write voltage or timing parameter based on the second determination.

14. The method of claim 8, wherein:
prior to performing the interface training operations:
the local memory of the storage controller is preloaded with an instance of the test data pattern that is local to the storage controller; and
the local memory of the storage medium is preloaded with an instance of the test data pattern that is local to the storage medium; and
while performing the interface training operations:
loading the test data pattern into the first controller buffer includes loading the instance of the test data pattern that is local to the storage controller into the first controller buffer; and
loading the test data pattern into the first storage medium buffer includes loading the instance of the test data pattern that is local to the storage medium into the first storage medium buffer.

15. A data storage system, comprising:
a storage medium including a plurality of memory cells;
a storage controller in communication with the storage medium;
an electrical interface configured to transfer data via a channel disposed between first interface circuitry in the storage controller and second interface circuitry in the storage medium; and
interface training means including:
means for loading a test data pattern from local memory of the storage controller into a first controller buffer of the storage controller;
means for loading the test data pattern from local memory of the storage medium into a first storage medium buffer of the storage medium; and
at the storage controller:
means for setting a first read voltage or timing parameter;
means for transferring the test data pattern from the first storage medium buffer to a second controller buffer of the storage controller using the first read voltage or timing parameter;
means for comparing, as a first comparison, (i) the test data pattern in the first controller buffer with (ii) the test data pattern in the second controller buffer;
means for determining a first read transfer error rate based on the first comparison; and
means for setting a runtime read voltage or timing parameter to the first read voltage or timing parameter based on a determination that the first read transfer error rate is below a predetermined read transfer error rate threshold.

16. The data storage system of claim 15, wherein the interface training means further include:
at the storage controller:
means for setting a second read voltage or timing parameter different from the first read voltage or timing parameter;
means for transferring the test data pattern from the first storage medium buffer to the second controller buffer using the second read voltage or timing parameter;
means for comparing, as an updated first comparison, (i) the test data pattern in the first controller buffer with (ii) the test data pattern in the second controller buffer; and
means for determining a second read transfer error rate based on the updated first comparison.

17. The data storage system of claim 16, wherein the interface training means further include:
at the storage controller:
means for determining, as a first determination, that the first read transfer error rate is lower than the second read transfer error rate; and
means for setting the runtime read voltage or timing parameter to the first read voltage or timing parameter based on the first determination.

18. The data storage system of claim 15, wherein the interface training means further include:
at the storage controller:
means for setting a first write voltage or timing parameter; and
means for transferring the test data pattern from the first controller buffer to a second storage medium buffer of the storage medium using the first write voltage or timing parameter; and
at the storage medium:
means for comparing, as a second comparison, (i) the test data pattern in the first storage medium buffer with (ii) the test data pattern in the second storage medium buffer;
means for determining a first write transfer error rate based on the second comparison; and
means for transmitting the first write transfer error rate to the storage controller.

19. The data storage system of claim 18, wherein the interface training means further include:
at the storage controller:
means for setting a second write voltage or timing parameter different from the first write voltage or timing parameter; and
means for transferring the test data pattern from the first controller buffer to the second storage medium buffer using the second write voltage or timing parameter; and
at the storage medium:
means for comparing, as an updated second comparison, (i) the test data pattern in the first storage medium buffer with (ii) the test data pattern in the second storage medium buffer; and means for determining a second write transfer error rate based on the updated second comparison; and means for transmitting the second write transfer error rate to the storage controller.

20. The data storage system of claim 19, wherein the interface training means further include:

at the storage controller:

means for determining, as a second determination, that the first write transfer error rate is lower than the second write transfer error rate or is below a predetermined write transfer error rate threshold; and means for setting a runtime write voltage or timing parameter to the first write voltage or timing parameter based on the second determination.

* * * * *